(12) United States Patent
Rehmeyer

(10) Patent No.: US 11,222,683 B2
(45) Date of Patent: Jan. 11, 2022

(54) APPARATUSES AND METHODS FOR STAGGERED TIMING OF TARGETED REFRESH OPERATIONS

(71) Applicant: MICRON TECHNOLOGY, INC., Boise, ID (US)

(72) Inventor: James S. Rehmeyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/008,396

(22) Filed: Aug. 31, 2020

(65) Prior Publication Data

US 2020/0395063 A1 Dec. 17, 2020

Related U.S. Application Data

(63) Continuation of application No. 16/818,981, filed on Mar. 13, 2020, now Pat. No. 10,825,505, which is a
(Continued)

(51) Int. Cl.
*G11C 11/406* (2006.01)
*G11C 8/12* (2006.01)
(Continued)

(52) U.S. Cl.
CPC .......... *G11C 11/40611* (2013.01); *G11C 8/12* (2013.01); *G11C 11/4076* (2013.01); *G11C 11/4087* (2013.01); *G11C 11/40618* (2013.01)

(58) Field of Classification Search
CPC . G11C 11/40611; G11C 11/4087; G11C 8/12; G11C 11/4076; G11C 11/40618; G11C 8/08; G11C 11/406
(Continued)

(56) References Cited

U.S. PATENT DOCUMENTS

| 5,299,159 A | 3/1994 | Balistreri et al. |
| 5,654,929 A | 8/1997 | Mote, Jr. |

(Continued)

FOREIGN PATENT DOCUMENTS

| CN | 101038785 A | 9/2007 |
| CN | 101067972 A | 11/2007 |

(Continued)

OTHER PUBLICATIONS

[Published as 2020-0219556-A1] U.S. Appl. No. 16/824,460, titles "Semiconductor Device Performing Row Hammer Refresh Operation", dated Mar. 19, 2020.

(Continued)

*Primary Examiner* — Michael T Tran
(74) *Attorney, Agent, or Firm* — Dorsey & Whitney LLP

(57) ABSTRACT

Embodiments of the disclosure are drawn to apparatuses and methods for staggering the timing of targeted refresh operations. Memory dies may need to periodically perform refresh operations, which may be auto-refresh operations or targeted refresh operations. Targeted refresh operations may draw less current than auto-refresh operations. When dies are collected into a group (e.g., a memory stack, a memory module) the timing of targeted refresh operations may be staggered between the different dies to help reduce the peak current drawn. The targeted refresh operations may be staggered such that, when a maximum number of the dies are performing a refresh operation, at least one of the dies performs a targeted refresh operation instead of an auto-refresh operation.

16 Claims, 9 Drawing Sheets

Related U.S. Application Data continuation of application No. 16/230,300, filed on Dec. 21, 2018, now abandoned.

(51) Int. Cl.
*G11C 11/4076* (2006.01)
*G11C 11/408* (2006.01)

(58) Field of Classification Search
USPC .......................................... 365/222, 230.06
See application file for complete search history.

(56) References Cited

U.S. PATENT DOCUMENTS

| | | | |
|---|---|---|---|
| 5,699,297 A | 12/1997 | Yamazaki et al. | |
| 5,933,377 A | 8/1999 | Hidaka | |
| 5,943,283 A | 8/1999 | Wong et al. | |
| 5,956,288 A | 9/1999 | Bermingham et al. | |
| 5,959,923 A | 9/1999 | Matteson et al. | |
| 5,970,507 A | 10/1999 | Kato et al. | |
| 5,999,471 A | 12/1999 | Choi | |
| 6,002,629 A | 12/1999 | Kim et al. | |
| 6,011,734 A | 1/2000 | Pappert | |
| 6,061,290 A | 5/2000 | Shirley | |
| 6,212,118 B1 | 4/2001 | Fujita | |
| 6,306,721 B1 | 10/2001 | Teo et al. | |
| 6,310,806 B1 | 10/2001 | Higashi et al. | |
| 6,363,024 B1 | 3/2002 | Fibranz | |
| 6,392,952 B1 | 5/2002 | Chen et al. | |
| 6,424,582 B1 | 7/2002 | Ooishi | |
| 6,434,064 B2 | 8/2002 | Nagai | |
| 6,452,868 B1 | 9/2002 | Fister | |
| 6,515,928 B2 | 2/2003 | Sato et al. | |
| 6,535,950 B1 | 3/2003 | Funyu et al. | |
| 6,567,340 B1 | 5/2003 | Nataraj et al. | |
| 6,950,364 B2 | 9/2005 | Kim | |
| 7,002,868 B2 | 2/2006 | Takahashi | |
| 7,057,960 B1 | 6/2006 | Fiscus et al. | |
| 7,082,070 B2 | 7/2006 | Hong | |
| 7,187,607 B2 | 3/2007 | Koshikawa et al. | |
| 7,203,113 B2 | 4/2007 | Takahashi et al. | |
| 7,203,115 B2 | 4/2007 | Eto et al. | |
| 7,209,402 B2 | 4/2007 | Shinozaki et al. | |
| 7,215,588 B2 | 5/2007 | Lee | |
| 7,444,577 B2 | 10/2008 | Best et al. | |
| 7,551,502 B2 | 6/2009 | Dono et al. | |
| 7,565,479 B2 | 7/2009 | Best et al. | |
| 7,692,993 B2 | 4/2010 | Iida et al. | |
| 7,830,742 B2 | 11/2010 | Han | |
| 8,174,921 B2 | 5/2012 | Kim et al. | |
| 8,400,805 B2 | 3/2013 | Yoko | |
| 8,572,423 B1 * | 10/2013 | Isachar | G06F 3/0659 |
| | | | 713/340 |
| 8,625,360 B2 | 1/2014 | Iwamoto et al. | |
| 8,681,578 B2 | 3/2014 | Narui | |
| 8,756,368 B2 | 6/2014 | Best et al. | |
| 8,811,100 B2 | 8/2014 | Ku | |
| 8,862,973 B2 | 10/2014 | Zimmerman et al. | |
| 8,938,573 B2 | 1/2015 | Greenfield et al. | |
| 9,032,141 B2 | 5/2015 | Bains et al. | |
| 9,047,978 B2 | 6/2015 | Bell et al. | |
| 9,076,499 B2 | 7/2015 | Schoenborn et al. | |
| 9,087,602 B2 | 7/2015 | Youn et al. | |
| 9,117,544 B2 | 8/2015 | Bains et al. | |
| 9,123,447 B2 | 9/2015 | Lee et al. | |
| 9,153,294 B2 | 10/2015 | Kang | |
| 9,190,137 B2 | 11/2015 | Kim et al. | |
| 9,190,139 B2 | 11/2015 | Jung et al. | |
| 9,236,110 B2 | 1/2016 | Bains et al. | |
| 9,251,885 B2 | 2/2016 | Greenfield et al. | |
| 9,286,964 B2 | 3/2016 | Halbert et al. | |
| 9,299,400 B2 | 3/2016 | Bains et al. | |
| 9,311,984 B1 | 4/2016 | Hong et al. | |
| 9,311,985 B2 | 4/2016 | Lee et al. | |
| 9,324,398 B2 | 4/2016 | Jones et al. | |
| 9,384,821 B2 | 7/2016 | Bains et al. | |
| 9,390,782 B2 | 7/2016 | Best et al. | |
| 9,396,786 B2 | 7/2016 | Yoon et al. | |
| 9,406,358 B1 | 8/2016 | Lee | |
| 9,412,432 B2 | 8/2016 | Narui et al. | |
| 9,418,723 B2 | 8/2016 | Chishti et al. | |
| 9,424,907 B2 | 8/2016 | Fujishiro | |
| 9,484,079 B2 | 11/2016 | Lee | |
| 9,514,850 B2 | 12/2016 | Kim | |
| 9,570,143 B2 | 2/2017 | Lim et al. | |
| 9,570,201 B2 | 2/2017 | Morgan et al. | |
| 9,646,672 B1 | 5/2017 | Kim et al. | |
| 9,653,139 B1 | 5/2017 | Park | |
| 9,672,889 B2 | 6/2017 | Lee et al. | |
| 9,685,240 B1 | 6/2017 | Park | |
| 9,691,466 B1 | 6/2017 | Kim | |
| 9,697,913 B1 | 7/2017 | Mariani et al. | |
| 9,734,887 B1 | 8/2017 | Tavva | |
| 9,741,409 B2 | 8/2017 | Jones et al. | |
| 9,741,447 B2 | 8/2017 | Akamatsu | |
| 9,747,971 B2 | 8/2017 | Bains et al. | |
| 9,761,297 B1 | 9/2017 | Tomishima | |
| 9,786,351 B2 | 10/2017 | Lee et al. | |
| 9,799,391 B1 | 10/2017 | Wei | |
| 9,805,782 B1 | 10/2017 | Liou | |
| 9,805,783 B2 | 10/2017 | Ito et al. | |
| 9,812,185 B2 | 11/2017 | Fisch et al. | |
| 9,818,469 B1 | 11/2017 | Kim et al. | |
| 9,831,003 B2 | 11/2017 | Sohn et al. | |
| 9,865,326 B2 | 1/2018 | Bains et al. | |
| 9,865,328 B1 | 1/2018 | Desimone et al. | |
| 9,922,694 B2 | 3/2018 | Akamatsu | |
| 9,934,143 B2 | 4/2018 | Bains et al. | |
| 9,953,696 B2 | 4/2018 | Kim | |
| 9,978,430 B2 | 5/2018 | Seo et al. | |
| 10,020,045 B2 | 7/2018 | Riho | |
| 10,020,046 B1 * | 7/2018 | Uemura | G11C 11/4093 |
| 10,032,501 B2 | 7/2018 | Ito et al. | |
| 10,049,716 B2 | 8/2018 | Proebsting | |
| 10,083,737 B2 | 9/2018 | Bains et al. | |
| 10,090,038 B2 | 10/2018 | Shin | |
| 10,134,461 B2 | 11/2018 | Bell et al. | |
| 10,141,042 B1 | 11/2018 | Richter | |
| 10,147,472 B2 | 12/2018 | Jones et al. | |
| 10,153,031 B2 | 12/2018 | Akamatsu | |
| 10,170,174 B1 | 1/2019 | Ito et al. | |
| 10,192,608 B2 | 1/2019 | Morgan | |
| 10,210,925 B2 | 2/2019 | Bains et al. | |
| 10,297,305 B1 | 5/2019 | Moon et al. | |
| 10,297,307 B1 | 5/2019 | Raad et al. | |
| 10,339,994 B2 | 7/2019 | Ito et al. | |
| 10,381,327 B2 | 8/2019 | Ramachandra et al. | |
| 10,446,256 B2 | 10/2019 | Ong et al. | |
| 10,468,076 B1 | 11/2019 | He et al. | |
| 10,490,250 B1 | 11/2019 | Ito et al. | |
| 10,490,251 B2 | 11/2019 | Wolff | |
| 10,504,577 B1 | 12/2019 | Alzheimer | |
| 10,510,396 B1 | 12/2019 | Notani et al. | |
| 10,572,377 B1 | 2/2020 | Zhang et al. | |
| 10,573,370 B2 | 2/2020 | Ito et al. | |
| 10,607,679 B2 | 3/2020 | Nakaoka | |
| 10,657,377 B2 | 5/2020 | Gopalan | |
| 10,685,696 B2 | 6/2020 | Brown et al. | |
| 10,699,796 B2 | 6/2020 | Benedict et al. | |
| 10,790,005 B1 | 9/2020 | He et al. | |
| 10,825,505 B2 | 11/2020 | Rehmeyer | |
| 10,832,792 B1 | 11/2020 | Penney et al. | |
| 10,930,335 B2 | 2/2021 | Bell et al. | |
| 10,943,636 B1 | 3/2021 | Wu et al. | |
| 10,950,289 B2 | 3/2021 | Ito et al. | |
| 10,978,132 B2 | 4/2021 | Rehmeyer et al. | |
| 11,017,833 B2 | 5/2021 | Wu et al. | |
| 11,069,393 B2 | 7/2021 | Cowles et al. | |
| 11,081,160 B2 | 8/2021 | Ito et al. | |
| 2001/0008498 A1 | 7/2001 | Ooishi | |
| 2002/0026613 A1 | 2/2002 | Niiro | |
| 2002/0181301 A1 | 12/2002 | Takahashi et al. | |
| 2002/0191467 A1 | 12/2002 | Matsumoto et al. | |
| 2003/0026161 A1 | 2/2003 | Yamaguchi et al. | |

(56) References Cited

U.S. PATENT DOCUMENTS

| | | |
|---|---|---|
| 2003/0063512 A1 | 4/2003 | Takahashi et al. |
| 2003/0067825 A1 | 4/2003 | Shimano et al. |
| 2003/0081483 A1 | 5/2003 | De Paor et al. |
| 2003/0123301 A1 | 7/2003 | Jang et al. |
| 2003/0161208 A1 | 8/2003 | Nakashima et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0024955 A1 | 2/2004 | Patel |
| 2004/0114446 A1 | 6/2004 | Takahashi et al. |
| 2004/0130959 A1 | 7/2004 | Kawaguchi |
| 2004/0184323 A1 | 9/2004 | Mori et al. |
| 2004/0218431 A1 | 11/2004 | Chung et al. |
| 2005/0002268 A1 | 1/2005 | Otsuka et al. |
| 2005/0041502 A1 | 2/2005 | Perner |
| 2005/0105362 A1 | 5/2005 | Choi et al. |
| 2005/0108460 A1* | 5/2005 | David .............. G11C 11/40615 711/5 |
| 2005/0213408 A1 | 9/2005 | Shieh |
| 2005/0243627 A1 | 11/2005 | Lee et al. |
| 2005/0265104 A1 | 12/2005 | Remaklus et al. |
| 2006/0018174 A1 | 1/2006 | Park et al. |
| 2006/0083099 A1 | 4/2006 | Bae et al. |
| 2006/0087903 A1 | 4/2006 | Riho et al. |
| 2006/0104139 A1 | 5/2006 | Hur et al. |
| 2006/0176744 A1 | 8/2006 | Stave |
| 2006/0215474 A1 | 9/2006 | Hokenmaier |
| 2006/0233012 A1* | 10/2006 | Sekiguchi ............... H01L 24/50 365/51 |
| 2006/0262616 A1 | 11/2006 | Chen |
| 2006/0262617 A1 | 11/2006 | Lee |
| 2006/0268643 A1 | 11/2006 | Schreck et al. |
| 2007/0002651 A1 | 1/2007 | Lee |
| 2007/0008799 A1 | 1/2007 | Dono et al. |
| 2007/0014175 A1* | 1/2007 | Min .................. G11C 11/40622 365/222 |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0147154 A1 | 6/2007 | Lee |
| 2007/0237016 A1 | 10/2007 | Miyamoto et al. |
| 2007/0263442 A1* | 11/2007 | Cornwell ............... G11C 29/78 365/185.03 |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0212386 A1 | 9/2008 | Riho |
| 2008/0224742 A1 | 9/2008 | Pomichter |
| 2008/0253212 A1 | 10/2008 | Iida et al. |
| 2008/0253213 A1* | 10/2008 | Sato .................... G11C 11/4085 365/222 |
| 2008/0266990 A1 | 10/2008 | Loeffler |
| 2008/0270683 A1 | 10/2008 | Barth et al. |
| 2008/0306723 A1 | 12/2008 | De Ambroggi et al. |
| 2008/0316845 A1 | 12/2008 | Wang et al. |
| 2009/0021999 A1 | 1/2009 | Tanimura et al. |
| 2009/0052264 A1 | 2/2009 | Hong et al. |
| 2009/0059641 A1 | 3/2009 | Jeddeloh |
| 2009/0073760 A1 | 3/2009 | Betser et al. |
| 2009/0161468 A1 | 6/2009 | Fujioka |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0228739 A1 | 9/2009 | Cohen et al. |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0061153 A1 | 3/2010 | Yen et al. |
| 2010/0074042 A1 | 3/2010 | Fukuda et al. |
| 2010/0097870 A1 | 4/2010 | Kim et al. |
| 2010/0110809 A1* | 5/2010 | Kobayashi ............ G11C 29/848 365/200 |
| 2010/0110810 A1 | 5/2010 | Kobayashi |
| 2010/0124138 A1 | 5/2010 | Lee et al. |
| 2010/0128547 A1 | 5/2010 | Kagami |
| 2010/0131812 A1 | 5/2010 | Mohammad |
| 2010/0141309 A1 | 6/2010 | Lee |
| 2010/0157693 A1 | 6/2010 | Iwai et al. |
| 2010/0182862 A1 | 7/2010 | Teramoto |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0134715 A1* | 6/2011 | Norman ................. G11C 11/005 365/230.03 |
| 2011/0216614 A1 | 9/2011 | Hosoe |
| 2011/0225355 A1 | 9/2011 | Kajigaya |
| 2011/0299352 A1 | 12/2011 | Fujishiro et al. |
| 2011/0310648 A1 | 12/2011 | Iwamoto et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0155173 A1 | 6/2012 | Lee et al. |
| 2012/0155206 A1 | 6/2012 | Kodama et al. |
| 2012/0213021 A1 | 8/2012 | Riho et al. |
| 2012/0254472 A1 | 10/2012 | Ware et al. |
| 2012/0287727 A1 | 11/2012 | Wang |
| 2012/0307582 A1 | 12/2012 | Marumoto et al. |
| 2012/0327734 A1 | 12/2012 | Sato |
| 2013/0003467 A1 | 1/2013 | Klein |
| 2013/0003477 A1 | 1/2013 | Park et al. |
| 2013/0028034 A1 | 1/2013 | Fujisawa |
| 2013/0051157 A1 | 2/2013 | Park |
| 2013/0051171 A1 | 2/2013 | Porter et al. |
| 2013/0077423 A1 | 3/2013 | Lee |
| 2013/0173971 A1 | 7/2013 | Zimmerman |
| 2013/0254475 A1 | 9/2013 | Perego et al. |
| 2013/0279284 A1 | 10/2013 | Jeong |
| 2014/0006700 A1* | 1/2014 | Schaefer ................. G11C 8/08 711/105 |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0089576 A1 | 3/2014 | Bains et al. |
| 2014/0089758 A1* | 3/2014 | Kwok .................. G06F 11/1012 714/755 |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0143473 A1 | 5/2014 | Kim et al. |
| 2014/0169114 A1 | 6/2014 | Oh |
| 2014/0177370 A1 | 6/2014 | Halbert et al. |
| 2014/0181453 A1* | 6/2014 | Jayasena ............... G06F 13/1694 711/170 |
| 2014/0185403 A1 | 7/2014 | Lai |
| 2014/0189228 A1 | 7/2014 | Greenfield et al. |
| 2014/0219042 A1 | 8/2014 | Yu et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0281206 A1 | 9/2014 | Crawford et al. |
| 2014/0281207 A1 | 9/2014 | Mandava et al. |
| 2014/0293725 A1 | 10/2014 | Best et al. |
| 2014/0321226 A1 | 10/2014 | Pyeon |
| 2015/0016203 A1 | 1/2015 | Sriramagiri et al. |
| 2015/0049566 A1 | 2/2015 | Lee et al. |
| 2015/0049567 A1 | 2/2015 | Chi |

(56) References Cited

U.S. PATENT DOCUMENTS

| | | |
|---|---|---|
| 2015/0055420 A1 | 2/2015 | Bell et al. |
| 2015/0078112 A1 | 3/2015 | Huang |
| 2015/0089326 A1 | 3/2015 | Joo et al. |
| 2015/0092508 A1 | 4/2015 | Bains |
| 2015/0109871 A1 | 4/2015 | Bains et al. |
| 2015/0134897 A1 | 5/2015 | Sriramagiri et al. |
| 2015/0162064 A1 | 6/2015 | Oh et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0213872 A1 | 7/2015 | Mazumder et al. |
| 2015/0243339 A1 | 8/2015 | Bell et al. |
| 2015/0255140 A1 | 9/2015 | Song |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2015/0380073 A1 | 12/2015 | Joo et al. |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0070483 A1* | 3/2016 | Yoon ............... G06F 13/1694 711/154 |
| 2016/0078846 A1 | 3/2016 | Liu et al. |
| 2016/0078911 A1 | 3/2016 | Fujiwara et al. |
| 2016/0086649 A1 | 3/2016 | Hong et al. |
| 2016/0093402 A1 | 3/2016 | Kitagawa et al. |
| 2016/0125931 A1 | 5/2016 | Doo et al. |
| 2016/0133314 A1 | 5/2016 | Hwang et al. |
| 2016/0155491 A1* | 6/2016 | Roberts ............. G11C 11/40607 711/106 |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0225433 A1 | 8/2016 | Bains et al. |
| 2016/0336060 A1* | 11/2016 | Shin ............... G11C 11/40607 |
| 2016/0343423 A1 | 11/2016 | Shido |
| 2017/0011792 A1 | 1/2017 | Oh et al. |
| 2017/0052722 A1 | 2/2017 | Ware et al. |
| 2017/0076779 A1 | 3/2017 | Bains et al. |
| 2017/0092350 A1 | 3/2017 | Halbert et al. |
| 2017/0111792 A1 | 4/2017 | Correia Fernandes et al. |
| 2017/0133085 A1 | 5/2017 | Kim et al. |
| 2017/0140807 A1 | 5/2017 | Sun et al. |
| 2017/0140810 A1* | 5/2017 | Choi ............... G11C 11/40607 |
| 2017/0140811 A1 | 5/2017 | Joo |
| 2017/0146598 A1* | 5/2017 | Kim ....................... G11C 29/18 |
| 2017/0148504 A1* | 5/2017 | Saifuddin ............. G06F 1/3225 |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0269861 A1* | 9/2017 | Lu ........................... G06F 12/06 |
| 2017/0287547 A1 | 10/2017 | Ito et al. |
| 2017/0323675 A1 | 11/2017 | Jones et al. |
| 2017/0345482 A1* | 11/2017 | Balakrishnan ........ G06F 3/0634 |
| 2017/0352404 A1 | 12/2017 | Lee et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0025773 A1 | 1/2018 | Bains et al. |
| 2018/0033479 A1 | 2/2018 | Lea et al. |
| 2018/0047110 A1 | 2/2018 | Blackman et al. |
| 2018/0061476 A1 | 3/2018 | Kim |
| 2018/0061483 A1 | 3/2018 | Morgan |
| 2018/0061485 A1 | 3/2018 | Joo |
| 2018/0075927 A1 | 3/2018 | Jeong et al. |
| 2018/0082737 A1 | 3/2018 | Lee |
| 2018/0096719 A1* | 4/2018 | Tomishima ............. G11C 5/025 |
| 2018/0102776 A1 | 4/2018 | Chandrasekar et al. |
| 2018/0107417 A1 | 4/2018 | Shechter et al. |
| 2018/0108401 A1 | 4/2018 | Choi et al. |
| 2018/0114561 A1 | 4/2018 | Fisch et al. |
| 2018/0114565 A1* | 4/2018 | Lee ..................... G11C 11/4087 |
| 2018/0122454 A1 | 5/2018 | Lee et al. |
| 2018/0130506 A1* | 5/2018 | Kang ..................... H04L 29/06 |
| 2018/0137005 A1* | 5/2018 | Wu ..................... G11C 11/4093 |
| 2018/0158504 A1 | 6/2018 | Akamatsu |
| 2018/0158507 A1 | 6/2018 | Bang |
| 2018/0182445 A1 | 6/2018 | Lee et al. |
| 2018/0190340 A1 | 7/2018 | Kim et al. |
| 2018/0218767 A1 | 8/2018 | Wolff |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0247876 A1* | 8/2018 | Kim ....................... G11C 29/32 |
| 2018/0254078 A1 | 9/2018 | We et al. |
| 2018/0261268 A1 | 9/2018 | Hyun et al. |
| 2018/0276150 A1 | 9/2018 | Eckert et al. |
| 2018/0285007 A1 | 10/2018 | Franklin et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0013059 A1 | 1/2019 | Akamatsu |
| 2019/0043558 A1* | 2/2019 | Suh .................... G11C 11/40618 |
| 2019/0051344 A1 | 2/2019 | Bell et al. |
| 2019/0065087 A1* | 2/2019 | Li ........................... G06F 1/3225 |
| 2019/0066759 A1 | 2/2019 | Nale |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0103147 A1 | 4/2019 | Jones et al. |
| 2019/0115069 A1 | 4/2019 | Lai |
| 2019/0122723 A1 | 4/2019 | Ito et al. |
| 2019/0129651 A1* | 5/2019 | Wuu ..................... G06F 3/0613 |
| 2019/0130960 A1 | 5/2019 | Kim |
| 2019/0130961 A1 | 5/2019 | Bell et al. |
| 2019/0147964 A1 | 5/2019 | Yun et al. |
| 2019/0161341 A1 | 5/2019 | Howe |
| 2019/0190341 A1 | 6/2019 | Beisele et al. |
| 2019/0196730 A1 | 6/2019 | Imran |
| 2019/0198078 A1 | 6/2019 | Hoang et al. |
| 2019/0198099 A1 | 6/2019 | Mirichigni et al. |
| 2019/0205253 A1* | 7/2019 | Roberts ............... G06F 12/0815 |
| 2019/0228810 A1 | 7/2019 | Jones et al. |
| 2019/0228815 A1 | 7/2019 | Morohashi et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0294348 A1 | 9/2019 | Ware et al. |
| 2019/0333573 A1 | 10/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0362774 A1 | 11/2019 | Kuramori et al. |
| 2019/0385661 A1 | 12/2019 | Koo et al. |
| 2019/0385667 A1 | 12/2019 | Morohashi et al. |
| 2019/0385668 A1 | 12/2019 | Fujioka et al. |
| 2019/0385670 A1 | 12/2019 | Notani et al. |
| 2019/0386557 A1 | 12/2019 | Wang et al. |
| 2019/0391760 A1 | 12/2019 | Miura et al. |
| 2019/0392886 A1* | 12/2019 | Cox ........................ G11C 7/225 |
| 2020/0005857 A1 | 1/2020 | Ito et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |
| 2020/0185026 A1 | 6/2020 | Yun et al. |
| 2020/0194056 A1 | 6/2020 | Sakurai et al. |
| 2020/0202921 A1 | 6/2020 | Morohashi et al. |
| 2020/0210278 A1 | 7/2020 | Rooney et al. |
| 2020/0211632 A1 | 7/2020 | Noguchi |
| 2020/0211633 A1 | 7/2020 | Okuma |
| 2020/0211634 A1 | 7/2020 | Ishikawa et al. |
| 2020/0219555 A1 | 7/2020 | Rehmeyer |
| 2020/0219556 A1 | 7/2020 | Ishikawa et al. |
| 2020/0265888 A1 | 8/2020 | Ito et al. |

(56) References Cited

U.S. PATENT DOCUMENTS

| | | | |
|---|---|---|---|
| 2020/0273517 A1 | 8/2020 | Yamamoto |
| 2020/0273518 A1 | 8/2020 | Raad et al. |
| 2020/0279599 A1 | 9/2020 | Ware et al. |
| 2020/0294569 A1 | 9/2020 | Wu et al. |
| 2020/0294576 A1 | 9/2020 | Brown et al. |
| 2020/0321049 A1 | 10/2020 | Meier et al. |
| 2020/0381040 A1 | 12/2020 | Penney et al. |
| 2020/0388324 A1 | 12/2020 | Rehmeyer et al. |
| 2020/0388325 A1 | 12/2020 | Cowles et al. |
| 2021/0057021 A1 | 2/2021 | Wu et al. |
| 2021/0057022 A1 | 2/2021 | Jenkinson et al. |
| 2021/0118491 A1 | 4/2021 | Li et al. |
| 2021/0166752 A1 | 6/2021 | Noguchi |
| 2021/0183433 A1 | 6/2021 | Jenkinson et al. |
| 2021/0183435 A1 | 6/2021 | Meier et al. |
| 2021/0225431 A1 | 7/2021 | Rehmeyer et al. |
| 2021/0304813 A1 | 9/2021 | Cowles et al. |

FOREIGN PATENT DOCUMENTS

| | | | |
|---|---|---|---|
| CN | 104350546 A | 2/2015 |
| CN | 106710621 A | 5/2017 |
| CN | 107871516 A | 4/2018 |
| JP | 2005-216429 A | 8/2005 |
| JP | 2011-258259 A | 12/2011 |
| JP | 4911510 B2 | 1/2012 |
| JP | 2013-004158 A | 1/2013 |
| JP | 6281030 B1 | 1/2018 |
| WO | 2014120477 | 8/2014 |
| WO | 2015030991 A1 | 3/2015 |
| WO | 2017171927 A1 | 10/2017 |
| WO | 2019222960 A1 | 11/2019 |
| WO | 2020010010 A1 | 1/2020 |
| WO | 2020117686 A1 | 6/2020 |
| WO | 2020247163 A1 | 12/2020 |
| WO | 2020247639 A1 | 12/2020 |

OTHER PUBLICATIONS

U.S. Appl. No. 16/655,110 titled "Apparatuses and Methods for Dynamic Targeted Refresh Steals", filed Oct. 16, 2019.

U.S. Appl. No. 16/997,766 titled "Refresh Logic Circuit Layouts Thereof", filed Aug. 19, 2020.

U.S. Appl. No. 17/095,978 titled "Apparatuses and Methods for Controlling Refresh Timing", filed Nov. 12, 2020.

U.S. Appl. No. 16/176,932, titled "Apparatuses and Methods for Access Based Refresh Timing", filed Oct. 31, 2018.

U.S. Appl. No. 16/374,623, titled "Semiconductor Device Performing Row Hammer Refresh Operation", filed Apr. 3, 2019.

U.S. Appl. No. 17/030,018, titled "Apparatuses and Methods for Controlling Refresh Operations", filed Sep. 23, 2020, pp. all.

U.S. Appl. No. 17/175,485 titled "Apparatuses and Methods for Distributed Targeted Refresh Operations", filed Feb. 12, 2021.

[Published as 2020-0219555-A1] U.S. Appl. No. 16/818,981, titled "Apparatus and Methods for Staggered Timing of Targeted Refresh Operations", filed Mar. 13, 2020.

[Published as US-2020-0005857-A1] U.S. Appl. No. 16/025,844, titled "Apparatus and Methods for Triggering Row Hammer Address Sampling", filed Jul. 2, 2018.

[Published as US-2020-0176050-A1] U.S. Appl. No. 16/783,063, titled "Apparatus and Methods for Triggering Row Hammer Address Sampling", dated Feb. 5, 2020.

[Published as US-2020-0211632-A1] U.S. Appl. No. 16/232,837, titled "Apparatuses and Methods for Distributed Targeted Refresh Operations", filed Dec. 26, 2018.

[Published as US-2020-0211634-A1] U.S. Appl. No. 16/818,989, titled "Semiconductor Device Performing Row Hammer Refresh Operation", dated Mar. 13, 2020.

U.S. Appl. No. 16/788,657, titled "Semiconductor Device Performing Row Hammer Refresh Operation", dated Feb. 12, 2020.

U.S. Appl. No. 16/537,981 titled "Apparatuses and Methods for Controlling Targeted Refresh Rates", filed Aug. 12, 2019.

U.S. Appl. No. 16/084,119, titled "Apparatuses and Methods for Pure-Time, Self Adopt Sampling for Row Hammer Refresh Sampling", filed Sep. 11, 2018.

U.S. Appl. No. 16/208,217, titled "Semiconductor Device Performing Row Hammer Refresh Operation", filed Dec. 3, 2018.

U.S. Appl. No. 16/230,300, titled "Apparatuses and Methods for Staggered Timing of Targeted Refresh Operations", filed Dec. 21, 2018.

U.S. Appl. No. 16/286,187 titled "Apparatuses and Methods for Memory Mat Refresh Sequencing", filed Feb. 26, 2019.

U.S. Appl. No. 16/290,730, titled "Semiconductor Device Performing Row Hammer Refresh Operation", filed Mar. 1, 2019.

U.S. Appl. No. 16/375,716 titled "Stagger RHR Pumping Scheme Across Die Banks", filed Apr. 4, 2019; pp. all.

U.S. Appl. No. 16/431,641 titled "Apparatuses and Methods for Controlling Steal Rates", filed Jun. 4, 2019.

U.S. Appl. No. 16/549,411 titled "Apparatuses and Methods for Dynamic Refresh Allocation", filed Aug. 23, 2019.

U.S. Appl. No. 16/682,606, titled "Apparatuses And Methods For Distributing Row Hammer Refresh Events Across A Memory Device", filed Nov. 13, 2019.

U.S. Appl. No. 16/886,284, titled "Apparatuses and Methods for Access Based Refresh Timing", dated May 28, 2020.

U.S. Appl. No. 17/324,621 titled "Apparatuses And Methods for Pure-Time, Self-Adopt Sampling For Row Hammer Refresh Sampling", filed May 19, 2021.

U.S. Appl. No. 17/347,957 titled "Apparatuses and Methods for Controlling Steal Rates", filed Jun. 15, 2021.

U.S. Appl. No. 16/994,338 titled "Apparatuses, Systems, and Methods for Memory Directed Access Pause", filed Aug. 14, 2020, pp. all.

U.S. Appl. No. 16/997,659 titled "Apparatuses, Systems, and Methods for Refresh Modes", filed Aug. 19, 2020; pp. all.

U.S. Appl. No. 17/127,654 titled "Apparatuses and Methods for Row Hammer Based Cache Lockdown", filed Dec. 18, 2020, pp. all.

Application No. PCT/US20/23689, titled "Semiconductor Device Having Cam That Stores Address Signals", dated Mar. 19, 2020, pp. all.

U.S. Appl. No. 16/797,658, titles "Apparatuses and Methods for Controlling Refresh Operations", filed Feb. 21, 2020; pp. all.

U.S. Appl. No. 16/805,197, titled "Apparatuses and Methods for Calculating Row Hammer Refresh Addresses in a Semiconductor Device", dated Feb. 28, 2020; pp. all.

U.S. Appl. No. 16/268,818, titled "Apparatuses and Methods for Managing Row Access Counts", filed Feb. 6, 2019; pp. all.

U.S. Appl. No. 16/358,587, titled "Semiconductor Device Having Cam That Stores Address Signals", dated Mar. 19, 2019, pp. all.

U.S. Appl. No. 16/411,573, titled "Apparatuses, Systems, and Methods for a Content Addressable Memory Cell", filed May 14, 2019, pp. all.

U.S. Appl. No. 16/428,625 titled "Apparatuses and Methods for Tracking Victim Rows", filed May 31, 2019, pp. all.

U.S. Appl. No. 16/513,400 titled "Apparatuses and Methods for Tracking Row Accesses", filed Jul. 16, 2019, pp. all.

U.S. Appl. No. 16/548,027 titled "Apparatuses, Systems, and Methods for Analog Row Access Rate Determination", filed Aug. 22, 2019, pp. all.

U.S. Appl. No. 16/549,942, titled "Apparatuses and Methods for Lossy Row Access Counting", filed Aug. 23, 2019, pp. all.

U.S. Appl. No. 16/546,152 titled "Apparatuses and Methods for Analog Row Access Tracking", filed Aug. 20, 2019, pp. all.

U.S. Appl. No. 15/881,256 entitled 'Apparatuses and Methods for Detecting a Row Hammer Attack With a Bandpass Filter', filed Jan. 26, 2018, pp. all.

U.S. Appl. No. 16/425,525 titled "Apparatuses And Methods For Tracking All Row Accesses", filed May 29, 2019, pp. all.

U.S. Appl. No. 16/427,105 titled "Apparatuses And Methods For Priority Targeted Refresh Operations", filed May 30, 2019, pp. all.

U.S. Appl. No. 16/427,140 titled "Apparatuses And Methods For Tracking Row Access Counts Between Multiple Register Stacks", filed May 30, 2019, pp. all.

(56) References Cited

OTHER PUBLICATIONS

U.S. Appl. No. 16/437,811 titled "Apparatuses, Systems, And Methods For Determining Extremum Numerical Values", filed Jun. 11, 2019, pp. all.
U.S. Appl. No. 17/186,913 titled "Apparatuses and Methods for Dynamic Refresh Allocation", filed Feb. 26, 2021, pp. all.
U.S. Appl. No. 17/187,002 titled "Apparatuses and Methods for Staggered Timing of Targeted Refresh Operations", filed Feb. 26, 2021, pp. all.
U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory", filed Oct. 27, 2017; pp. all.
U.S. Appl. No. 16/012,679, titled "Apparatuses and Methods for Multiple Row Hammer Refresh Address Sequences", filed Jun. 19, 2018, pp. all.
U.S. Appl. No. 16/020,863, titled "Semiconductor Device", filed Jun. 27, 2018, pp. all.
U.S. Appl. No. 16/112,471 titled "Apparatuses and Methods for Controlling Refresh Operations", filed Aug. 24, 2018, pp. all.
U.S. Appl. No. 16/160,801, titled "Apparatuses and Methods for Selective Row Refreshes", filed Oct. 15, 2018, pp. all.
U.S. Appl. No. 16/231,327 titled "Apparatuses and Methods for Selective Row Refreshes", filed Dec. 21, 2018, pp. all.
U.S. Appl. No. 16/237,291, titled "Apparatus and Methods for Refreshing Memory", filed Dec. 31, 2018, pp. all.
U.S. Appl. No. 16/411,698 title "Semiconductor Device", filed May 14, 2019, pp. all.
U.S. Appl. No. 16/427,330 titled "Apparatuses and Methods for Storing Victim Row Data", filed May 30, 2019, pp. all.
U.S. Appl. No. 15/876,566 entitled 'Apparatuses and Methods for Calculating Row Hammer Refresh Addresses in a Semiconductor Device', filed Jan. 22, 2018, pp. all.
U.S. Appl. No. 16/656,084, titled: Apparatuses And Methods For Targeted Refreshing Of Memory, filed Jul. 21, 2017, pp. all.
U.S. Appl. No. 16/459,520 titled "Apparatuses and Methods for Monitoring Word Line Accesses", filed Jul. 1, 2019, pp. all.
PCT Application No. PCT/US18/55821 "Apparatus and Methods for Refreshing Memory" filed Oct. 15, 2018., pp. all.
U.S. Appl. No. 15/715,846, entitled "Semiconductor Device", filed Sep. 26, 2017, pp. all.
U.S. Appl. No. 15/888,993, entitled "Apparatuses and Methods for Controlling Refresh Operations", filed Feb. 5, 2018, pp. all.
U.S. Appl. No. 16/190,627 titled "Apparatuses and Methods for Targeted Refreshing of Memory", filed Nov. 14, 2018, pp. all.
U.S. Appl. No. 15/281,818, entitled: "Semiconductor Device", filed Sep. 30, 2016, pp. all.
Kim, et al., "Flipping Bits in MemoryWithout Accessing Them: An Experimental Study of DRAM Disturbance Errors", IEEE, Jun. 2014, 12 pgs.
U.S. Appl. No. 16/432,604 titled "Apparatuses and Methods for Staggered Timing of Skipped Refresh Operations", filed Jun. 5, 2019, pp. all.
U.S. Appl. No. 17/226,975, titled "Apparatuses and Methods for Staggered Timing of Skipped Refresh Operations", filed Apr. 9, 2021, pp. all.

* cited by examiner

APPARATUSES AND METHODS FOR STAGGERED TIMING OF TARGETED REFRESH OPERATIONS

CROSS-REFERENCE TO RELATED APPLICATION(S)

This application is a continuation of U.S. patent application Ser. No. 16/818,981, filed on Mar. 13, 2020, which is a continuation of U.S. patent application Ser. No. 16/230,300, filed on Dec. 21, 2018. The aforementioned applications are incorporated herein by reference, in its entirety, for any purposes.

BACKGROUND

Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. An auto-refresh operation may be carried out where a sequence of memory cells are periodically refreshed. Repeated access to a particular memory cell or group of memory cells (often referred to as a 'row hammer') may cause an increased rate of data degradation in nearby memory cells. It may be desirable to identify and refresh memory cells affected by the row hammer in a targeted refresh operation in addition to the auto-refresh operation. The targeted refresh operations may occur with timing interspersed between the auto-refresh operations.

DETAILED DESCRIPTION

Figure 1:
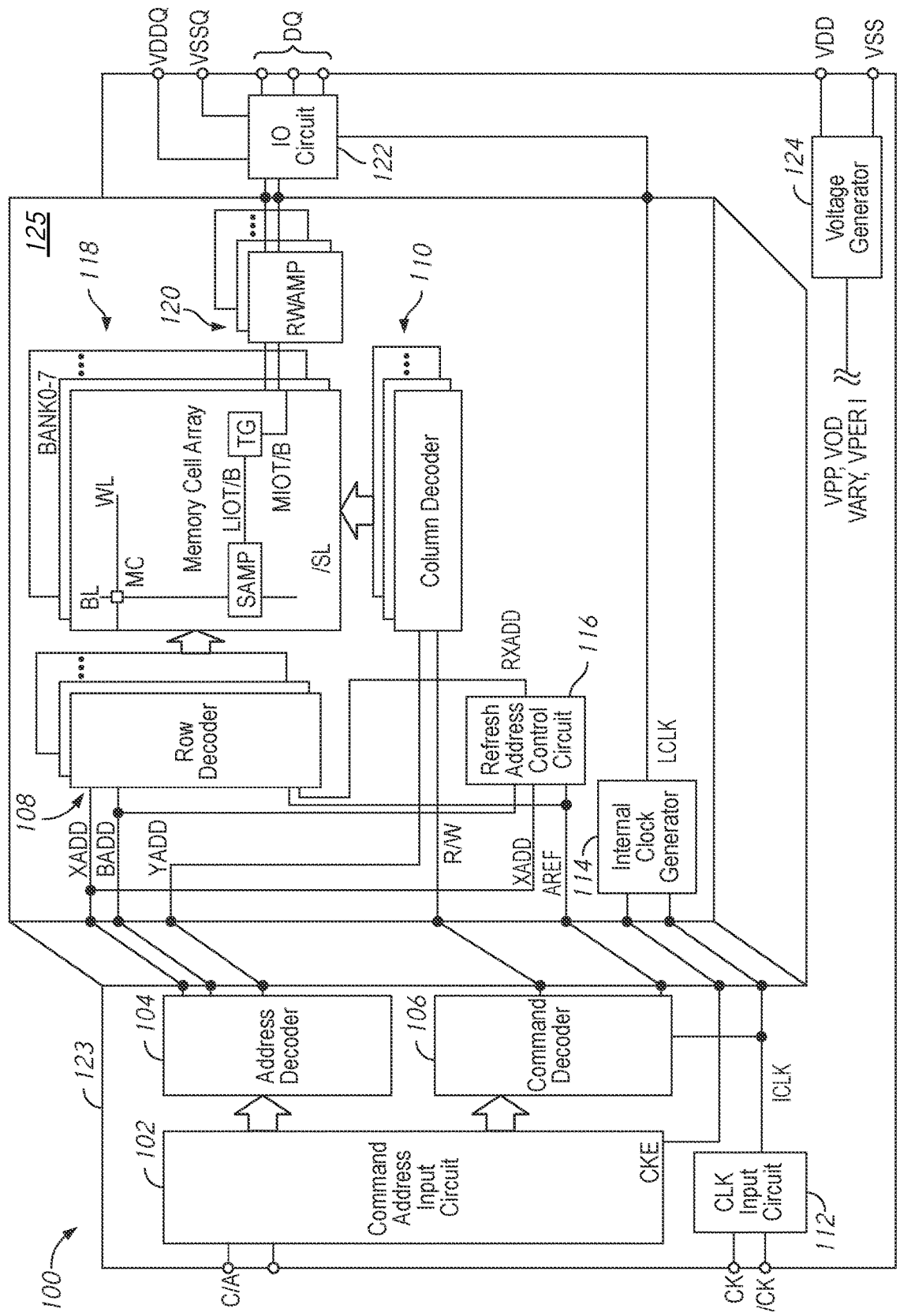
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a plurality of memory cells. The memory cells may store information, and may be organized at the intersection of word lines (rows) and bit lines (columns). The word lines and bit lines may be organized into a memory bank, and the memory device may include at least one memory die which includes one or more memory banks. One or more memory dies may be organized into a memory package. In some embodiments, the memory dies of the memory package may be stacked on each other. In some embodiments, one or more memory packages may be organized into a memory module. The memory device may receive one or more command signals which may indicate operations in one or more of the dies of one or more memory packages. The memory dies may be coupled to the command signals in common, may receive commands from a master die and/or interface chip, and/or may individually receive commands. For example, the memory dies of the package may receive a refresh signal, which may control the timing of refresh operations in the memory dies.

Information in the memory cells may decay over time. The memory cells may be refreshed on a row-by-row basis. During a refresh operation, the information in one or more rows may be read out and then written back to the respective rows. A refresh signal (such as auto-refresh signal AREF) may control a timing of the refresh operations. In some embodiments, the memory device may generate one or more "pumps", which may be activations of an internal refresh signal responsive to receiving an activation of the refresh signal. The memory dies may be capable of performing more than one type of refresh operation responsive to the refresh signal and/or refresh pumps. The memory dies may have internal logic which determines which type of refresh operation to perform and/or may receive signals (e.g., from an interface and/or controller) which indicates which type of refresh operation should be performed.

One type of refresh operation may be an auto-refresh operation. Responsive to an auto-refresh operation (which may have timing based on an activation of the auto-refresh signal and/or an activation of a pump), each of the dies in the memory stack may refresh a group of rows of the memory in the sequence, and then may refresh a next group of rows of the memory responsive to a next auto-refresh operation. The auto-refresh operation may cycle through the different rows of the memory to prevent data loss, and may refresh each row with a timing based on a normal rate of data degradation in the memory cells.

Another type of refresh operation may be a targeted row refresh operations. Repeated access to a particular row of memory (e.g., an aggressor row) may cause an increased rate of decay in neighboring rows (e.g., victim rows) due, for example, to electromagnetic coupling between the rows. Information in the victim rows may decay at a rate such that data may be lost if they aren't refreshed until the next auto-refresh operation of that row. In order to prevent information from being lost, it may be necessary to identify aggressor rows and then carry out a targeted refresh operation where one or more associated victim rows can be refreshed. In some embodiments, the targeted refresh operation may "steal" a timeslot (e.g., an activation of a pump, an activation of the auto-refresh signal) which would have otherwise been used for an auto-refresh operation.

It may be important to control an amount of current drawn by the memory device during refresh operations. An auto-refresh operation may draw more current than a targeted refresh operation, since more rows may be refreshed during a given auto-refresh operation than are refreshed during a given targeted refresh operation. In some embodiments, too many memory dies performing an auto-refresh operation at the same time may cause the memory device to draw more current than an allowable amount of current.

The present disclosure is drawn to apparatuses, systems, and methods for staggering timing of refresh operations. Since targeted refresh operations draw less current than auto-refresh operations, it may be desirable to reduce the number of memory dies which are simultaneously performing an auto-refresh operation by having some dies perform a targeted refresh operation instead. For example, at a moment in time when a maximum number of dies are performing a refresh operation, at least one of the dies may perform a targeted refresh operation instead of an auto-refresh operation. In an example implementation, each of the dies may perform a targeted refresh operation at a different activation of a refresh timing signal (e.g., an auto-refresh signal and/or a pump). Thus, a first memory die may perform a targeted refresh operation and a second die may perform an auto-refresh operation responsive to a first activation of a refresh timing signal, and the first memory die may perform an auto-refresh operation and the second die may perform a targeted refresh operation responsive to a second activation of the refresh timing signal.

FIG. 1 is a block diagram of a semiconductor device according to at least one embodiment of the disclosure. The semiconductor device 100 may be a semiconductor memory device, such as a DRAM device integrated on a single semiconductor chip. The example device 100 of FIG. 1 includes a memory package such as the stack 125 of memory dies positioned on a substrate 123, which may function as (and may be referred to) as an interface. Although certain components are shown in the dies of the stack 125, and certain components on the substrate 123, other arrangement of the components of the device 100 between the stack 125 and the substrate 123 are possible in other example embodiments. In some embodiments, the device 100 may include multiple stacks 125.

For brevity and clarity of illustration, only the components of one memory die in the memory stack 125 are shown in FIG. 1. Generally, the different dies of the stack 125 may each have similar components to each other. In some embodiments, each die of the stack 125 may be physically identical to each other. The substrate 123 may act as an interface, and may send and receive information (e.g., data, commands) to and from the outside, while the memory dies in the stack 125 communicate with components of the substrate. As described herein, commands and other signals sent by the substrate 123 may be sent to all dies in the stack 125 or may be separately addressed to individual dies of the stack 125.

The semiconductor device 100 includes a memory array 118. The memory array 118 may be positioned in a die of the memory stack 125. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. The row and column decoders 108 and 110 may also be positioned in the dies of the memory stack 125. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ. The external terminals may be positioned on the substrate 123.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. In some embodiments, the address decoder 104 may also indicate a particular memory die of the memory stack 125 for activation. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address (and optional die address) are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is output to outside from the data terminals DQ via the input/output circuit 122.

The device 100 may receive an access command which is a write command. When the write command is received, and a bank address, a row address and a column address (and optional die address) are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out refresh operation. The refresh signal AREF may be a pulse signal which is activated when the command decoder 106 receives a signal which indicates a refresh command. In some embodiments, the refresh command may be externally issued to the memory device 100. In some embodiments, the refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to the refresh address control circuit 116. The refresh address control circuit 116 supplies a refresh row address RXADD to the row decoder 108, which may refresh a wordline WL indicated by the refresh row address RXADD. The refresh address control circuit 116 may control a timing of the refresh operation, and may generate and provide the refresh address RXADD. The refresh address control circuit 116 may be controlled to change details of the refreshing address RXADD (e.g., how the refresh address is calculated, the timing of the refresh addresses), or may operate based on internal logic.

The refresh address control circuit 116 may selectively provide as the refreshing address RXADD either a targeted refresh address (e.g., a victim address) as part of a targeted refresh operation or one or more automatic refresh addresses (auto-refresh address) as part of auto-refresh operation. The automatic refresh addresses may be part of a sequence of addresses which are provided based on activations of the auto-refresh signal AREF. The refresh address control circuit 116 may cycle through the sequence of auto-refresh addresses at a rate determined by AREF. Multiple addresses may be provided as the refreshing address RXADD as part of an auto-refresh operation. In some embodiments, a group or block of addresses may all be indicated by the refresh address RXADD, and the row decoder 108 may refresh the entire group or block of addresses.

The refresh address control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118. The refresh address control circuit 116 may selectively use one or more signals of the device 100 to calculate the targeted refresh address RXADD. For example, the refresh address RXADD may be a calculated based on the row addresses XADD provided by the address decoder. In some embodiments, the refresh address control circuit 116 may sample the current value of the row address XADD provided by the address decoder 104 and determine a targeted refresh address based on one or more of the sampled addresses.

The targeted refresh address may be based on characteristics over time of the row addresses XADD received from the address decoder 104. The refresh address control circuit 116 may sample the current row address XADD to determine its characteristics over time. The sampling may occur intermittently, with each sample acquired based on a random or semi-random timing. The refresh address control circuit 116 may use different methods to calculate a targeted refresh address based on the sampled row address XADD. For example, the refresh address control circuit 116 may determine if a given row is an aggressor address, and then calculate and provide addresses corresponding to victim addresses of the aggressor address as the targeted refresh address. In some embodiments, more than one victim address may correspond to a given aggressor address. In this case the refresh address control circuit may queue up multiple targeted refresh addresses, and provide them sequentially when it determines that a targeted refresh address should be provided. The refresh address control circuit 116 may provide the targeted refresh address right away, or may queue up the targeted refresh address to be provided at a later time (e.g., in the next time slot available for a targeted refresh).

The refresh address RXADD may be provided with a timing based on a timing of the refresh signal AREF. The refresh address control circuit 116 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto-refresh address. In some embodiments, certain time slots may be reserved for targeted refresh addresses, and the refresh address control circuit 116 may determine whether to provide a targeted refresh address, not provide an address during that time slot, or provide an auto-refresh address instead during the time slot.

In some embodiments, the refresh address control circuit 116 may include logic, such as a state machine and/or counter which is used to determine if an auto-refresh operation or a targeted refresh operation will be performed. For example, the refresh address control circuit may count a number of activations of the refresh signal AREF with a counter. When the counter reaches a maximum value and 'rolls over' back to a minimum value, a targeted refresh operation may be performed. The logic may also be coupled to settings, such as fuse settings, which may be used to alter the operation of the logic in a given die.

Since more addresses may be provided as the refresh address RXADD during an auto-refresh operation than during a targeted refresh operation, an auto-refresh operation may draw more current (e.g., more power) than a targeted refresh operation. To reduce a peak current pulled by the device 100 at any given point in time during a refresh operation, targeted refresh operations may be staggered in time between different dies of the memory stack (and/or between other organizations of the memory arrays 118). The different dies of the memory stack 125 may have settings which cause the targeted refresh operations to occur at different times in the different dies. In one example implementation, the refresh address control circuits 116 in different dies in the memory stack 125 may indicate a targeted refresh operation with a frequency based on the refresh signal (e.g., a targeted refresh operation may be performed responsive to every $n^{th}$ activation of the refresh signal AREF). Each of the dies may perform targeted refresh operations with the same frequency, however settings in each of the dies (e.g., fuse settings) may offset the phase of the targeted refresh operations.

As previously described, the timings of the targeted refresh operations may be staggered in time to reduce a peak power drawn by the memory device 100 during a refresh operation. The settings of the different dies of the stack 125 may be set such that when a maximum number of simultaneous refresh operations would occur across one or more of the dies, at least one of the dies is performing a targeted refresh operation rather than an auto-refresh operation.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPER is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
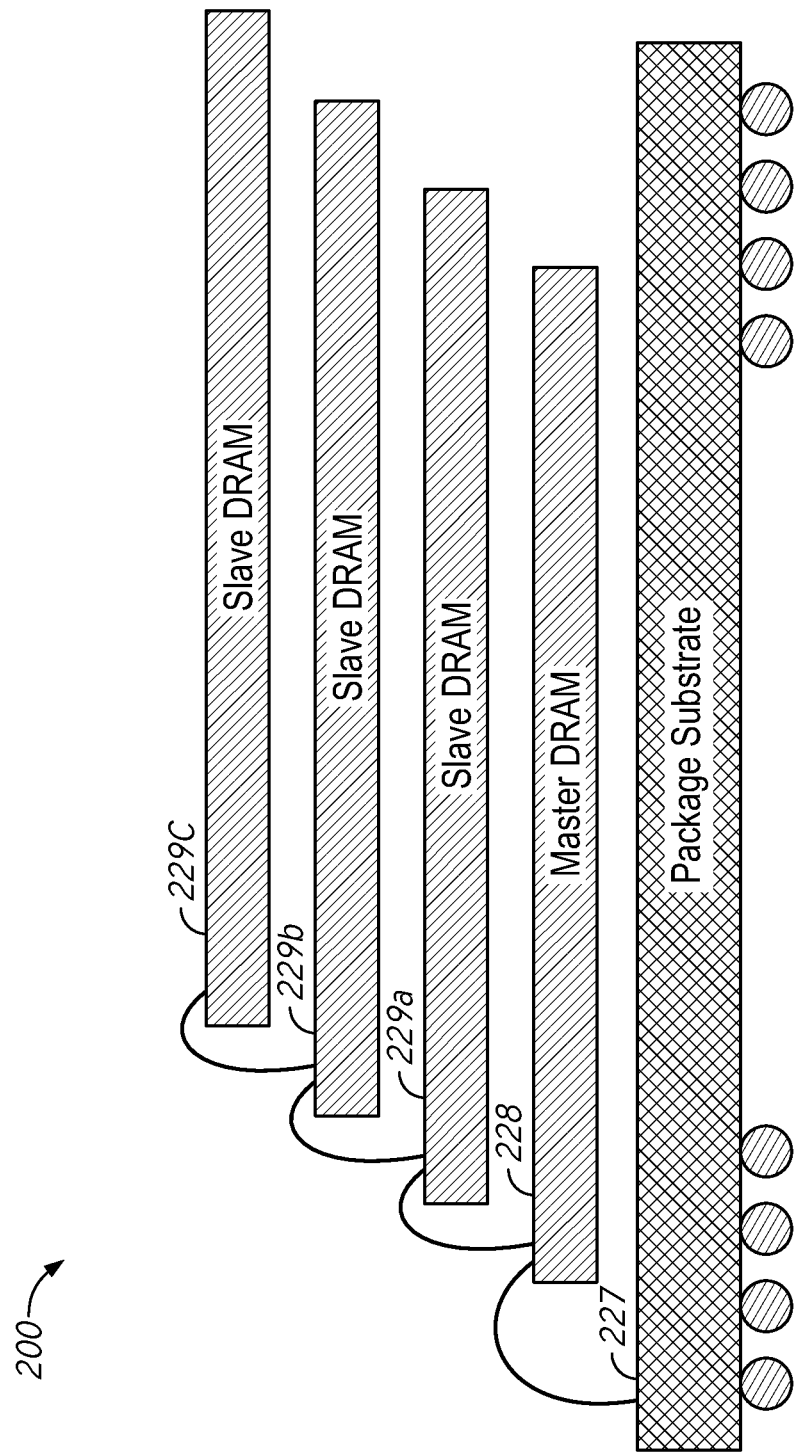
FIG. 2 is a block diagram of a master/slave configuration of a memory package according to an embodiment of the present disclosure.

FIG. 2 is a block diagram of a master/slave configuration of a memory package according to an embodiment of the present disclosure. The memory package 200 may be an implementation of the semiconductor device 100 and memory stack 125 of FIG. 1 in some embodiments. The memory package 200 is an example representing one possible organization of memory dies (and a substrate/interface) into a memory package which may be used in a memory device. The memory package 200 includes a package substrate 227, which includes terminals which send and receive information to other components outside the memory package 200. The package 200 also includes a master memory die (master die or master DRAM) 228, and a plurality of slave memory dies (slave dies or slave DRAMs) 229a-c. The master die 228 sends and receives signals to and from the substrate 227 and in turn provides signals to and receives signals from the slave dies 229a-c. Although only a single stack of dies 228 and 229a-c is shown, in some embodiments the package substrate 227 may include multiple stacks of dies.

Embodiments which are generally similar to the structure of the memory package 200 may be referred to as 3DS packages, and each of the dies may generally be referred to as a logical rank. The memory package 200 of FIG. 2, illustrates an example embodiment with 4 different memory dies (e.g., master die 228 and 3 slave dies 229a-c). In other example embodiments more or fewer memory dies may be used. For example, some memory stacks may include 8 or 2 memory dies.

Each of the master and slave memory dies 228 and 229a-c may include one or more memory arrays (e.g., memory array 118 of FIG. 1). The dies 228 and 229a-c may also each include other components of the memory device, such as refresh address control circuits (e.g., refresh address control circuit 116 of FIG. 1), and row and column decoders (e.g., 108 and 110 of FIG. 1). Other components of the memory device (e.g., the components of memory device 100 of FIG. 1 shown on the substrate 123) may be distributed between the substrate 227 and the memory dies 228 and 229a-c. In some embodiments, the master die 228 and each of the slave dies 229a-c may be physically identical to each other.

The master die 228 may be coupled to the substrate 227 and to the first slave die 229a. The first slave die 229a is coupled to the master die 228 and also to the next slave die 229b, and so forth. The dies 228 and 229a-c may be coupled to each other (and the substrate 227) with a variety of methods. In some embodiments, the dies may be coupled together with wire bonds. In some embodiments, the dies may be coupled together using through silicon vias (TSVs). In a 3DS package, there may be an additional power constraint based on the peak power (and/or current) which may be pulled through the couplings between the dies (e.g., the wire bonds and/or TSVs).

The substrate 227 may receive a refresh command which indicates that the package 200 should be put in a refresh state. In some embodiments, the command may specify one or more of the dies 228 and 229a-c which should be put in the refresh state. While in a refresh state, each of the dies 228 and 229a-c may perform one or more refresh operations (e.g., auto-refresh operations and/or targeted refresh operations). In some embodiments, responsive to a refresh command, the 3DS package 200 may not place all of the dies 228 and 229a-c (the logical ranks) into a refresh state at the same time. Instead, after one of the logical ranks begins performing a refresh operation, there may be a minimum timing which must elapse before a next logical rank can begin performing a refresh operation. Thus, there may be an offset of at least that minimum timing between a first refresh operation of a first logical rank and a first refresh operation of a second logical rank.

While the package 200 is in a refresh mode, the substrate 227 may receive a refresh command and provide it to the master die 228. The master die 228 may decode the refresh command and provide the refresh signal AREF to the slave dies 229a-c (as well as to internal components of the master die 228). The refresh signal may be periodically activated (e.g., raised to a high logical level). Each of the logical ranks may receive the refresh signal (e.g., AREF) from the substrate, which may control the timing of the refresh operations in the logical ranks. In some embodiments, the logical ranks (e.g., the dies 228 and 229a-c) may perform one or more refresh operations responsive to activations of the refresh signal. In some embodiments, the logical ranks may begin providing activations of a refresh pump signal responsive to receiving the refresh signal, and may perform refresh operations responsive to the activations of the refresh pump signal.

In some embodiments, each of the logical ranks may have a refresh address control circuit (e.g., 116 of FIG. 1) which determines whether an auto-refresh operation or a targeted refresh operation is going to occur. Each of the logical ranks (e.g., dies 228 and 229a-c) may include one or more settings which may determine the timing of auto-refresh and targeted refresh operations. For example, fuses in each of the dies 228 and 229a-c may be used to control the timing of the different types of refresh operation in each die. In some embodiments, responsive to a refresh signal (and/or the refresh pump signal), the dies may perform an auto-refresh operation. However, the dies may have a counter such that after a certain number of activations of the refresh signal (and/or refresh pump signal) they perform a targeted refresh operation instead. In some embodiments, the dies may perform the targeted refresh operations at the same frequency (e.g., after counting the same number of activations of the refresh signal) but may be offset it time by using settings to alter an initial value of the count. Other embodiments may use other methods to stagger the targeted refresh operations in time.

In some embodiments, the master die 228 may determine a timing of auto-refresh and targeted refresh operations in the master die 228 and each of the slave dies 229a-c. For example, the master die may provide a separate targeted refresh signal (e.g., RHR) for each of the slave dies 229a-c. The master die 228 may include internal logic, and may time when it provides each of the separate targeted refresh signals to their respective die. As an example operation, when the master die 228 receives a first activation of the refresh signal, it may send the targeted refresh signal to slave die 229a. When the master die 228 receives a second activation of the refresh signal, it may send the targeted refresh signal to slave die 229b. When the master die 228 receives a third activation of the refresh signal, it may send the targeted refresh signal to the slave die 229c. Upon a subsequent activation of the refresh signal, the master die 228 may repeat the cycle again. Other methods of operation may be used in other example embodiments.

In some embodiments, the refresh timing settings which control the timing of the auto-refresh and targeted refresh operations may be determined when the memory package 200 is assembled. In some embodiments, the timing settings may be determined based on the relative placement of the dies to each other (e.g., die 229a may take on certain timing settings based on the number of dies it is away from the master die 228, etc.).

Figure 3:
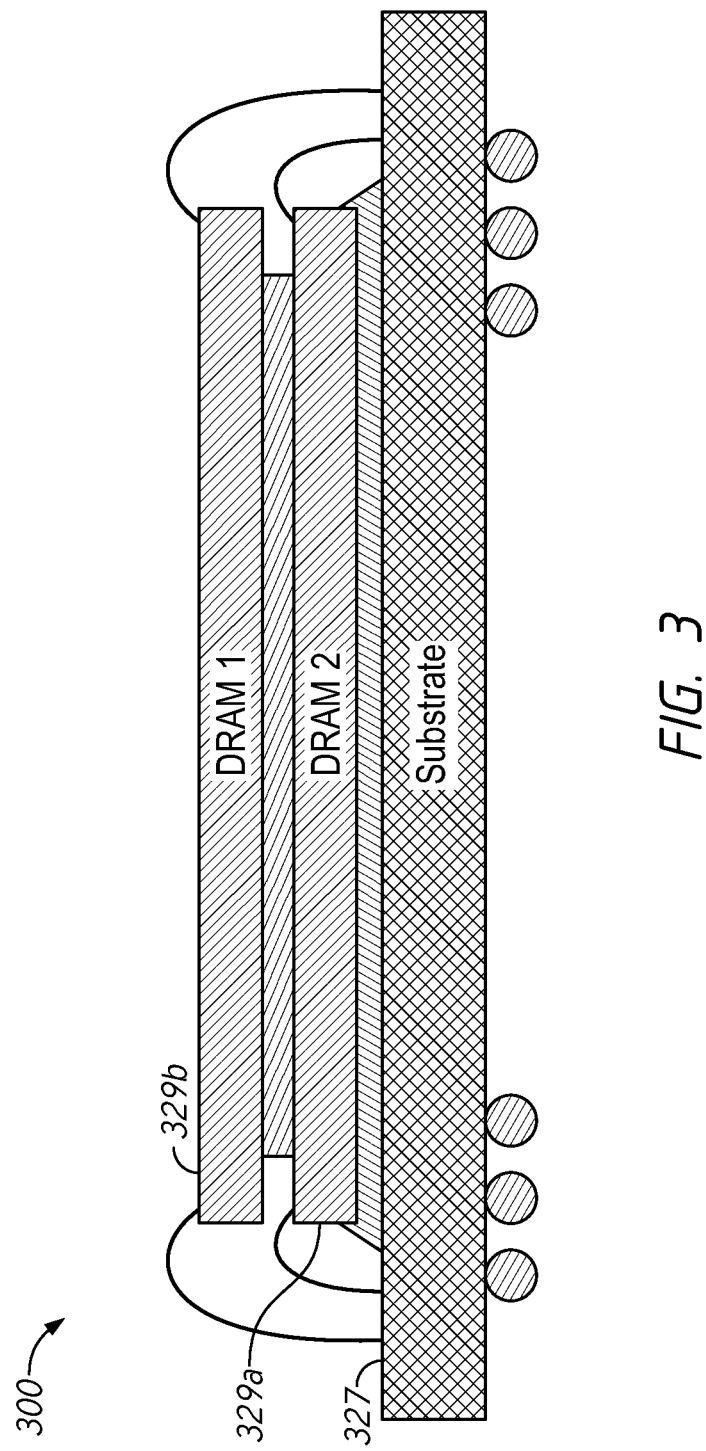
FIG. 3 is a block diagram of a memory package according to an embodiment of the present disclosure.

FIG. 3 is a block diagram of a memory package according to an embodiment of the present disclosure. The memory package 300 may be an example arrangement of the memory stack 125 and interface 123 of FIG. 1 in some embodiments. The memory package 300 may be different from the memory package 200 in that in the memory package 300, the dies 329a and 329b (e.g., DRAMs 229a-b) are each separately coupled to the substrate 327, rather than being coupled through a master die. The dies 329a-b may be coupled to the substrate 327 by wire bonds or by TSVs. The memory package 300 may generally operate in a manner similar to the memory package 200 of FIG. 2. For the sake of brevity, similar components, structures, and/or operations to those previously described are not repeated.

The substrate 327 may receive commands which are then passed to one or both of the dies 329a-b. In one embodiment, each die 329a and 329b may receive separate commands. In one embodiment, the dies 329a-b may receive the same commands at the same time. In either case, the two dies 329a-b may be in refresh mode at the same time.

Responsive to being in a refresh mode, the dies 329a-b may perform one or more refresh operations. The dies 329a-b may perform the refresh operations with timing based on a refresh signal, which the substrate 327 may provide. The dies 329a-b may perform either an auto-refresh operation or a targeted refresh operation responsive to the refresh signal. The dies 329a-b may stagger the timing of the targeted refresh operations. For example, the first die 329a may perform a targeted refresh operation responsive to a first activation of the refresh signal, while the second die 329b may perform a targeted refresh operation responsive to a second activation of the refresh signal. Settings, such as fuse settings, in the dies 329a-b may be used to control the timing of the refresh operations.

Although the memory package 300 shows a pair of dies 329a-b, more or fewer dies may be used in other embodiments. The embodiment using a pair of dies may generally be referred to as a dual-die package (DDP), while an embodiment with a single die may be a single die package (SDP).

Figure 4:
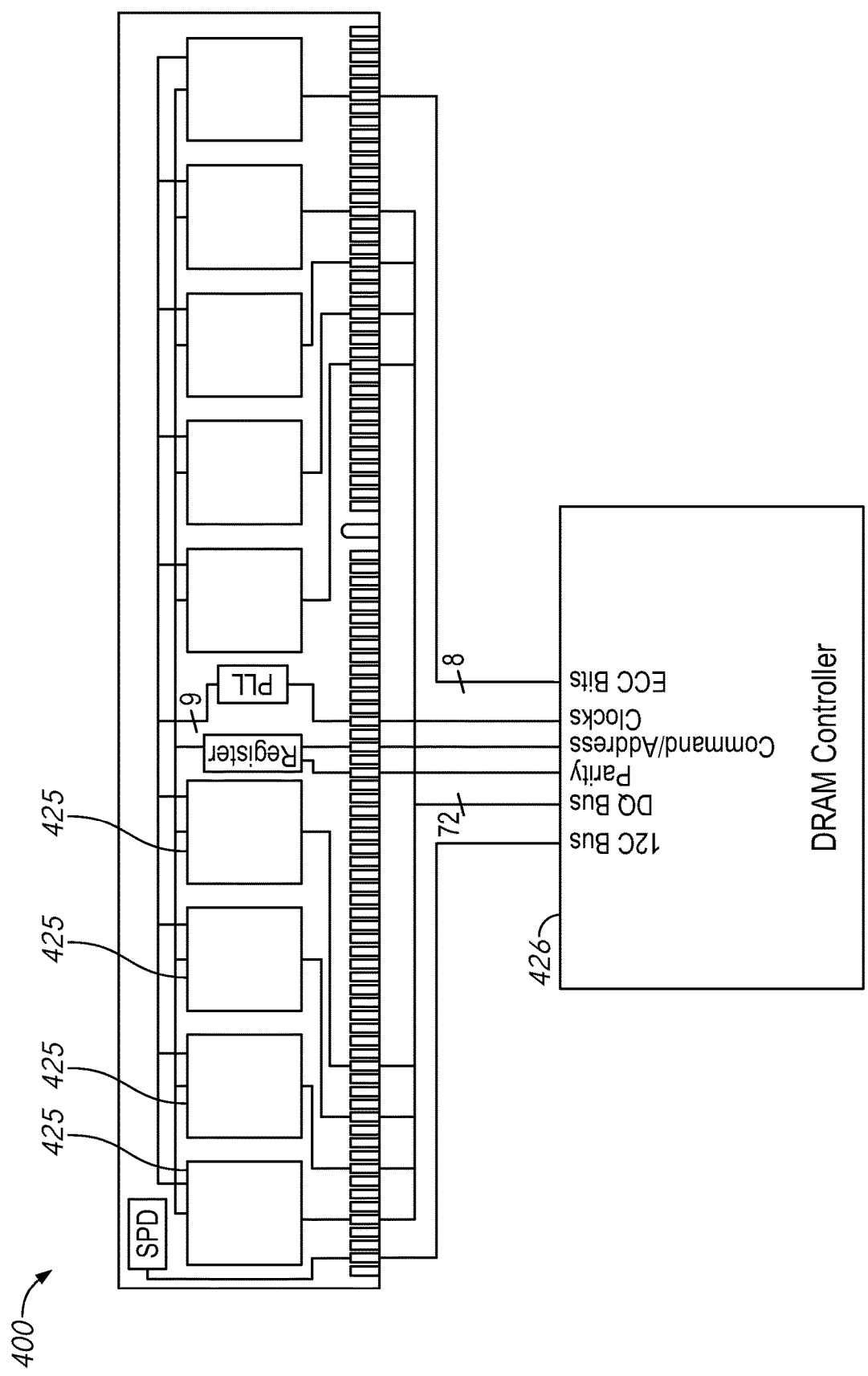
FIG. 4 is a block diagram of a memory module according to an embodiment of the present disclosure.

FIG. 4 is a block diagram of a memory module according to an embodiment of the present disclosure. One or more memory packages 425 may be organized together into a memory module 400. The memory packages 425 may be included on one or both sides of the memory module 400. Each of the memory packages 425 may be any arrangement of memory package, such as one or more of the memory device 100 of FIG. 1, the memory package 200 of FIG. 2 and/or the memory package 300 of FIG. 3. In some embodiments the memory packages 425 may all be the same type of memory package, in some embodiments, a mix of different types of memory packages may be used. A controller 426 may provide various command signals to the memory packages 425.

Although the memory module 400 shown in FIG. 4 having 9 memory packages 425, more or fewer packages 425 may be used in other embodiments. For example, in some embodiments, the memory packages 425 may be organized into different physical ranks. For example, there may be first physical rank on a first side of the module 400 (e.g., the 9 memory packages 425 as shown in FIG. 4) and a second physical rank on a back side of the module 400 (e.g., 9 more memory packages on a reverse side of the module 400). In some embodiments, there may be 18 packages 425 per physical rank, and one or more physical ranks in the memory module 400.

Figure 7:
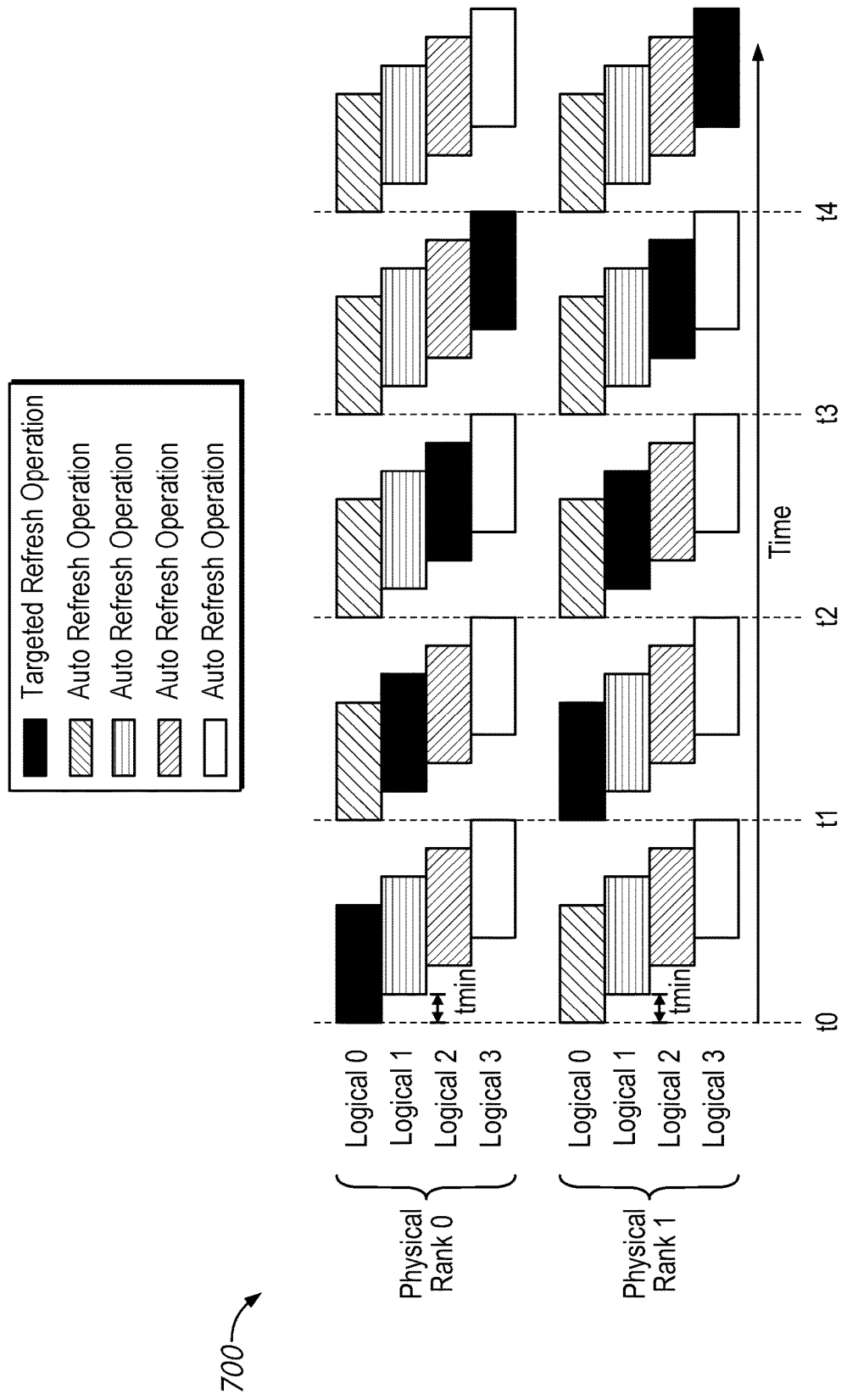
FIG. 7 is a timing diagram of a refresh operation according to an embodiment of the present disclosure.
Figure 8:
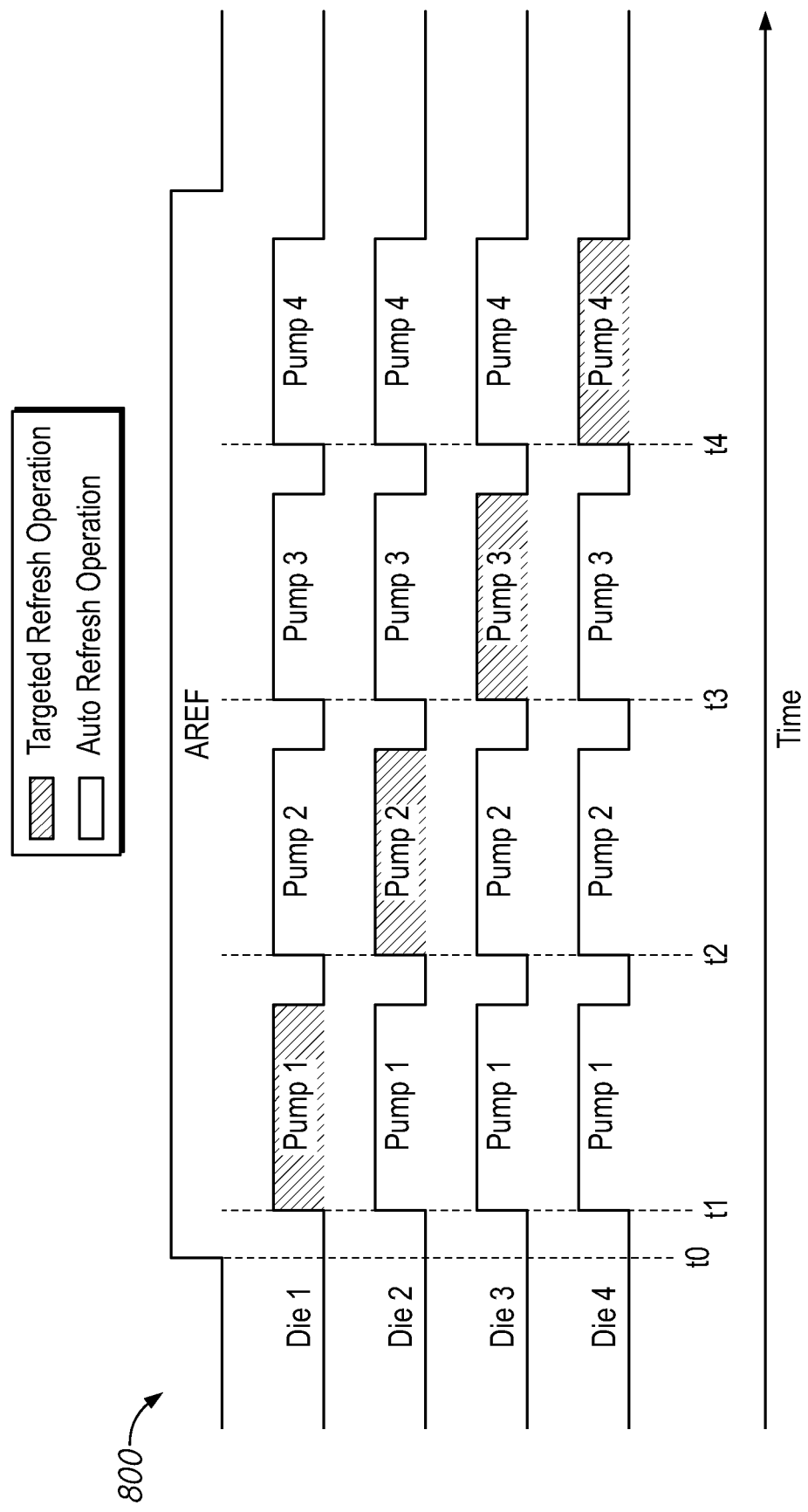
FIG. 8 is a timing diagram of staggered refresh timing between refresh pumps according to an embodiment of the present disclosure.
Figure 9:
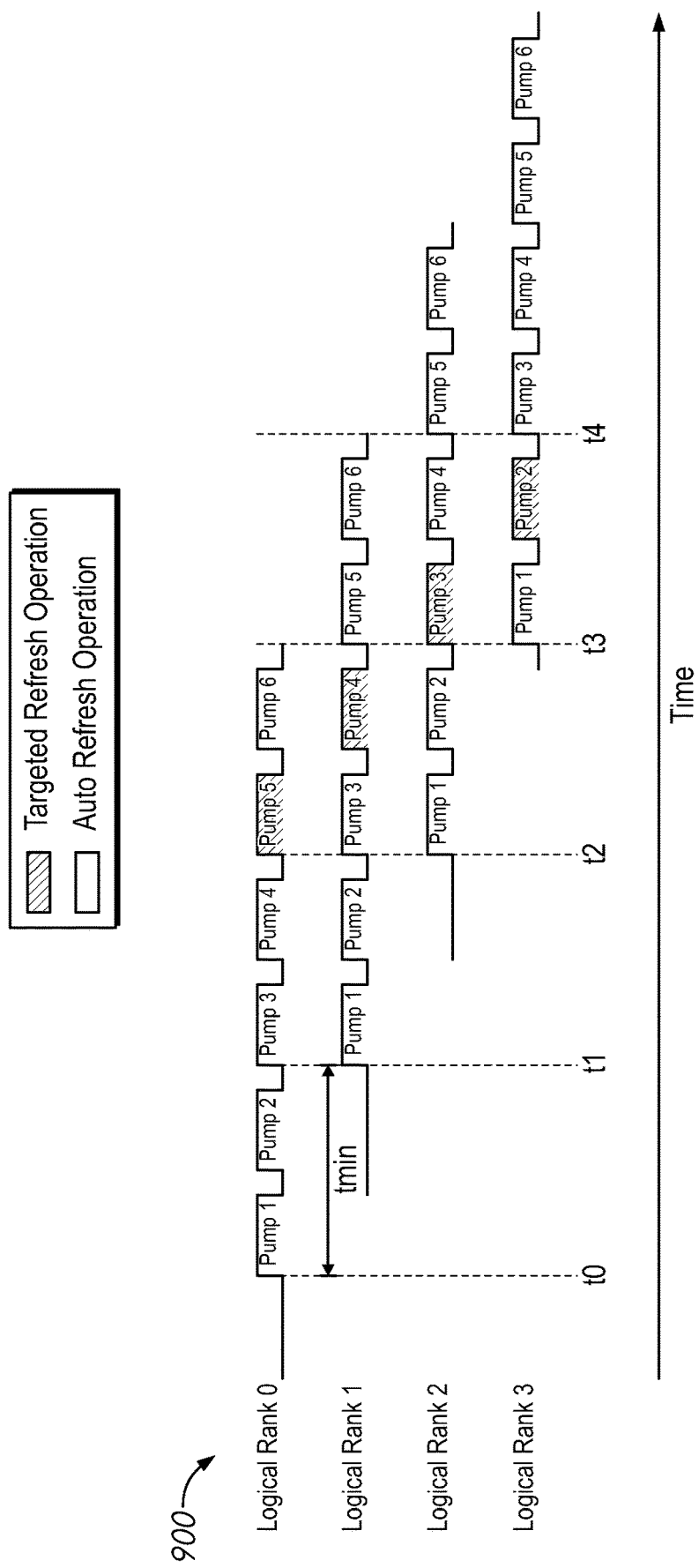
FIG. 9 is a timing diagram of staggered refresh operations according to an embodiment of the present disclosure.

Similar to spacing out the auto-refresh and targeted refresh operations within a memory package 425 as described herein, it may also be desirable to manage the timings between packages 425 of the module 400. For the sake of brevity, similar components, structures, and/or operations to those previously described are not repeated. For example, one or more of the packages 425 may be entered into a refresh mode, in which one or more of their respective dies performs either an auto-refresh operation or a targeted refresh operation. As well as being staggered between the dies of a given memory package, the targeted refresh operations may also be staggered between different packages 425 of the module. FIG. 7 shows an example operation of an embodiment where targeted refresh operations are distributed between different dies within a package (e.g., different logical ranks) and between different packages (e.g., different physical ranks). FIG. 8 shows an example operation of an embodiment where targeted refresh operations are distributed between different refresh pumps in different dies when the dies begin performing refresh operations at the same time. FIG. 9 shows an example operation of an embodiment similar to FIG. 8, except that each of the dies begins performing refresh operations at different times.

Figure 5:
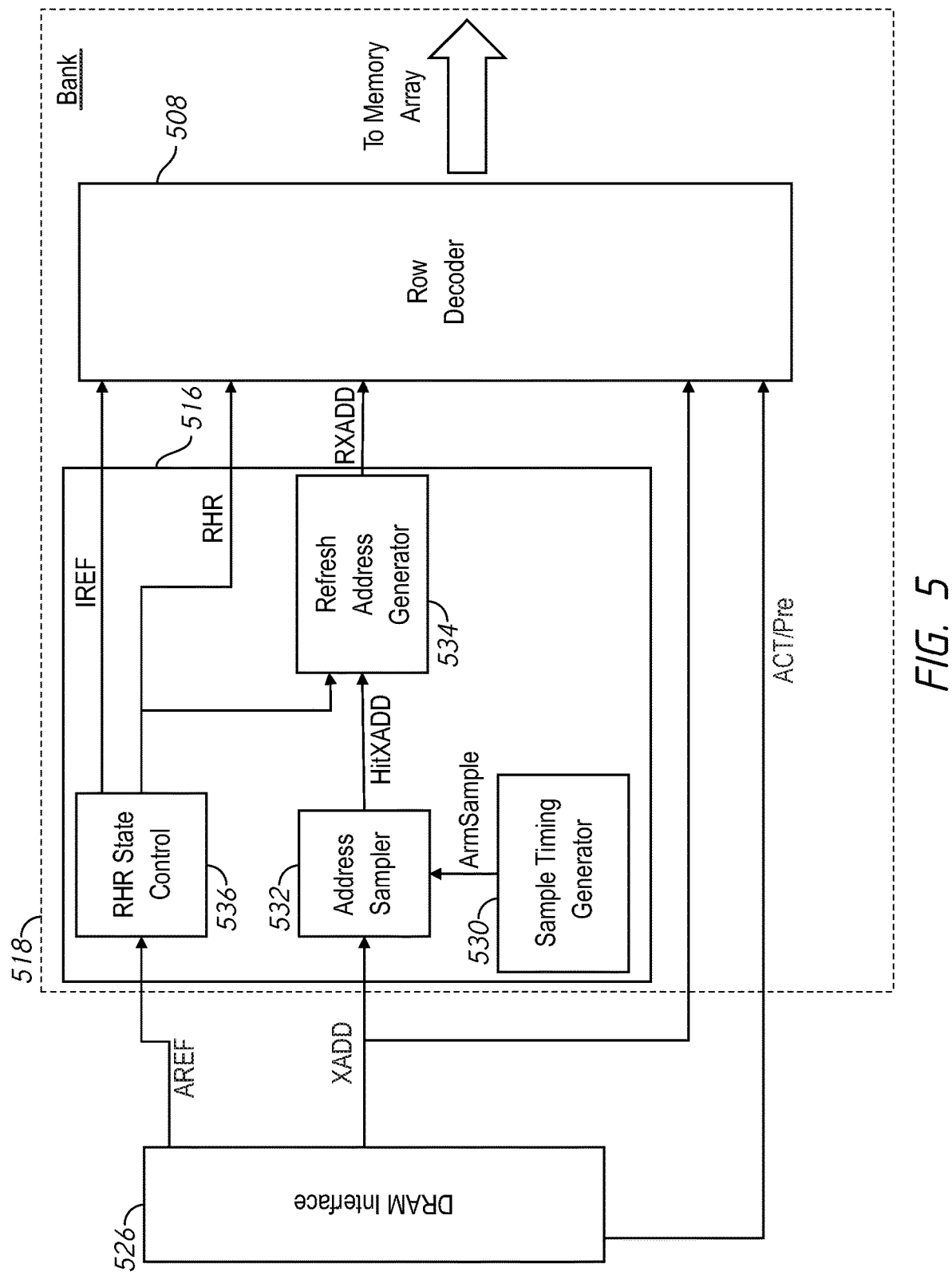
FIG. 5 is a block diagram of a refresh address control circuit according to an embodiment of the present disclosure.

FIG. 5 is a block diagram of a refresh address control circuit according to an embodiment of the present disclosure. Certain internal components and signals of the refresh address control circuit 516 are shown to illustrate the operation of the refresh address control circuit 516. The dotted line 518 is shown to represent that in certain embodiments, each of the components (e.g., the refresh address control circuit 516 and row decoder 508) may correspond to a particular bank of memory, and that these components may be repeated for each of the banks of memory. In some embodiments, the components shown within the dotted line 518 may be positioned in each of the memory banks. Thus, there may be multiple refresh address control circuits 516 and row decoders 508. For the sake of brevity, only components for a single bank will be described. In some embodiments, the refresh address control circuit 516 may implement the refresh address control circuit 116 of FIG. 1, and may be positioned in each die of a memory package.

A DRAM interface 526 may provide one or more signals to an address refresh control circuit 516 and row decoder 508. The refresh address control circuit 516 may include a sample timing generator 530, an address sampler 532, a row hammer refresh (RHR) state controller 536 and a refresh address generator 534. The DRAM interface 526 may provide one or more control signals, such as an auto-refresh signal AREF, and a row address XADD. The sample timing generator 530 generates a sampling signal ArmSample.

The refresh address control circuit 516 shows components associated with a particular implementation of detecting aggressor addresses by sampling incoming values of the row address XADD at random or semi-random timing. Other methods of detecting aggressor addresses may be used in other embodiments, and other components may be provided in the refresh address control circuit 516.

The address sampler 532 may sample (e.g., latch) the current row address XADD responsive to an activation of ArmSample. The address sampler 532 may also provide one or more of the latched addresses to the refresh address generator 534 as the matched address HitXADD. The RHR state controller 536 may provide the signal RHR to indicate that a row hammer refresh operation (e.g., a refresh of the victim rows corresponding to an identified aggressor row) should occur. The RHR state controller 536 may also provide an internal refresh signal IREF, to indicate that an auto-refresh operation should occur. The RHR state controller 536 may be used to control the timings of targeted refresh operations and auto-refresh operations. The RHR state controller 536 may be coupled to settings, such as fuse settings (and/or may include settings) which are die specific. In some embodiments, the RHR state controller 536 may include a counter, and may provide the signal RHR based on a number of activations of the refresh signal AREF. In some embodiments, the fuse settings may control an initial value of the counter in the RHR state controller 536. In this manner, different patterns of RHR and IREF may be generated in different dies (and/or different packages of a module) to stagger the timing of targeted refresh operations.

Responsive to an activation of RHR, the refresh address generator 534 may provide a refresh address RXADD, which may be an auto-refresh address or may be one or more victim addresses corresponding to victim rows of the aggressor row corresponding to the match address HitXADD. The row decoder 508 may perform a refresh operation responsive to the refresh address RXADD and the row hammer refresh signal RHR. The row decoder 508 may perform an auto-refresh operation based on the refresh address RXADD and the internal refresh signal IREF.

The DRAM interface 526 may represent one or more components which provides signals to components of the bank. In some embodiments, the DRAM interface 526 may represent a memory controller coupled to the semiconductor memory device (e.g., device 100 of FIG. 1). In some embodiments, the DRAM interface 526 may represent components such as the command address input circuit 102, the address decoder 104, and/or the command decoder 106 of FIG. 1. The DRAM interface 526 may provide a row address XADD, the auto-refresh signal AREF, an activation signal ACT, and a precharge signal Pre. The auto-refresh signal AREF may be a periodic signal which may indicate when an auto-refresh operation is to occur. In some embodiments (e.g., where the DRAM interface 526 represents a memory controller), the DRAM interface 526 may provide a refresh signal to the dies, and the dies may internally generate the auto-refresh signal AREF. The activation signal ACT may be provided to activate a given bank of the memory. The precharge signal Pre may be provided to precharge the given bank of the memory. The row address XADD may be a signal including multiple bits (which may be transmitted in series or in parallel) and may correspond to a specific row of an activated memory bank.

The sample timing generator 230 provides the sampling signal ArmSample. ArmSample may alternate between a low logic level and a high logic level. An activation of ArmSample may be a 'pulse', where ArmSample is raised to a high logic level and then returns to a low logic level. The interval between the pulses of ArmSample may be random, pseudo-random, and/or based on one or more signals of the device (e.g., AREF).

The address sampler 532 may receive the row address XADD from the DRAM interface 526 and ArmSample from the sample timing generator 530. The row address XADD may change as the DRAM interface 526 directs access operations (e.g., read and write operations) to different rows of the memory cell array (e.g., memory cell array 118 of FIG. 1). Each time the address sampler 532 receives an activation (e.g., a pulse) of ArmSample, the address sampler 532 may sample the current value of XADD. In some embodiments, the address sampler 532 may provide the currently sampled value of XADD as the match address HitXADD. The refresh address generator 234 may provide one or more victim addresses associated with the match address HitXADD as the refresh address RXADD.

In some embodiments, responsive to an activation of ArmSample, the address sampler 532 may determine if one or more rows is an aggressor row based on the sampled row address XADD, and may provide identified aggressor rows as the match address HitXADD. As part of this determination, the address sampler 532 may record (e.g., by latching and/or storing in a register) the current value of XADD responsive to the activation of ArmSample. The current value of XADD may be compared to previously recorded addresses in the address sampler 532 (e.g., the addresses stored in the latch/register), to determine access patterns over time of the sampled addresses. If the address sampler 532 determines that the current row address XADD is being repeatedly accessed (e.g., is an aggressor row), the activation of ArmSample may also cause the address sampler 532 to provide the address of the aggressor row as a match address HitXADD. In some embodiments, the match address (e.g., aggressor address) HitXADD may be stored in a latch circuit for later retrieval by the refresh address generator 534. For example, the value of one or more match addresses HitXADD may be stored until the signal RHR indicates a targeted refresh operation.

The RHR state controller 536 may receive the auto-refresh signal AREF and provide the row hammer refresh signal RHR. The auto-refresh signal AREF may be periodically generated and may be used to control the timing of refresh operations. The memory device may carry out a sequence of auto-refresh operations in order to periodically refresh the rows of the memory device. The RHR signal may be generated in order to indicate that the device should refresh a particular targeted row (e.g., a victim row) instead of an address from the sequence of auto-refresh addresses. The RHR state controller 536 may use internal logic to provide the RHR signal. In some embodiments, the RHR state controller 536 may provide the RHR signal based on certain number of activations of AREF (e.g., every $4^{th}$ activation of AREF). In some embodiments, a counter circuit may be used to track the number of activations of AREF. The die specific settings coupled to the RHR state controller 536 may change an initial value of the counter circuit.

The RHR state controller 536 may also provide an internal refresh signal IREF, which may control the timing of refresh operations. In some embodiments, there may be multiple activations of IREF for each activation of the refresh signal AREF. In some embodiments, the internal refresh signal REF may be used as a refresh pump signal to control the activations of refresh pumps. In some embodiments, each activation of AREF may be associated with a number of activations of IREF, which may be associated with a number of refresh operations, which may be a mix of targeted refresh operations and auto-refresh operations. For example, each activation of IREF may be associated with a refresh operation on the refresh address RXADD, while the state of RHR may determine if the refresh address RXADD is associated with an auto-refresh operation or a targeted refresh operation. In some embodiments, the signal IREF may be used to indicate that an auto-refresh operation should occur, while the signal RHR is used to indicate that a targeted refresh operation should occur. For example, the signals RHR and IREF may be generated such that they are not active at the same time (e.g., are not both at a high logic level at the same time) and each activation of IREF may be associated with an auto-refresh operation, while each activation of RHR may be associated with a targeted refresh operation.

In some embodiments, the DRAM interface 526 and/or the RHR state controller 536 may perform multiple refresh operations per activation of the refresh signal AREF. In these embodiments, responsive to an activation of the refresh signal AREF, the interface 526 and/or state controller 536 may provide one or more activations of a refresh pump signal. The RHR state controller 536 may provide either IREF or RHR responsive to each activation of the refresh pump signal. In some embodiments, there may be 4-6 activations of the refresh pump signal for each activation of the refresh signal AREF. More or fewer pumps may be used in other embodiments.

The refresh address generator 534 may receive the row hammer refresh signal RHR and the match address HitXADD. The match address HitXADD may represent an aggressor row. The refresh address generator 534 may determine the locations of one or more victim rows based on the match address HitXADD and provide them as the refresh address RXADD. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples.

The refresh address generator 534 may determine the value of the refresh address RXADD based on the row hammer refresh signal RHR. In some embodiments, when the signal RHR is not active, the refresh address generator 534 may provide one of a sequence of auto refresh addresses. When the signal RHR is active, the refresh address generator 534 may provide a targeted refresh address, such as a victim address, as the refresh address RXADD.

The row decoder 508 may perform one or more operations on the memory array (not shown) based on the received signals and addresses. For example, responsive to the activation signal ACT and the row address XADD (and IREF and RHR being at a low logic level), the row decoder 508 may direct one or more access operations (for example, a read operation) on the specified row address XADD. Responsive to the RHR signal being active, the row decoder 508 may refresh the refresh address RXADD.

Figure 6:
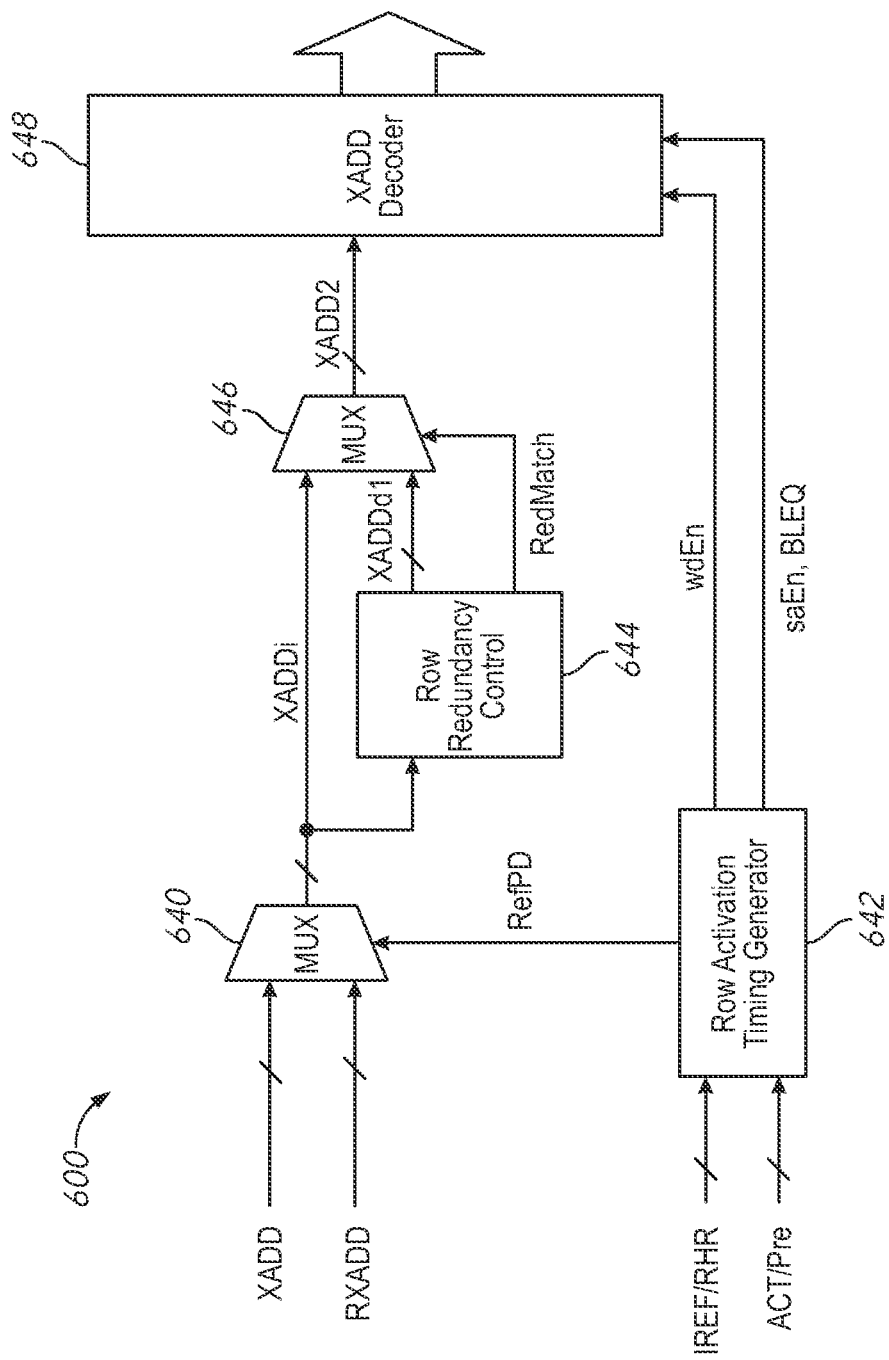
FIG. 6 is a block diagram of a row decoder according to an embodiment of the present disclosure.

FIG. 6 is a block diagram of a row decoder according to an embodiment of the present disclosure. The row decoder 600 may be included in the row decoder 108 of FIG. 1 in some embodiments of the disclosure. The row decoder 600 may determine whether to activate a word line of the memory bank (e.g., a bank of memory array 118 of FIG. 1) corresponding to the row address XADD or the refresh address RXADD.

As shown in FIG. 6, the row decoder 600 is provided with a row activation timing generator 642, which receives the internal refresh signal IREF and the row hammer refresh signal RHR, the active signal ACT, and the pre-charge signal Pre and provides a state signal RefPD, a word-line actuation signal wdEn, a sense-amplifier actuation signal saEn, and a bit-line equalize signal BLEQ. In some embodiments, the signals IREF and RHR may be the auto-refresh signal AREF. The state signal RefPD is supplied to a multiplexer 640, which selects one of the row address XADD and the refresh address RXADD. An address XADDi selected by the multiplexer 640 is supplied to a row redundancy control circuit 644. If the word line indicated by the address XADDi is replaced by a redundant word line, a hit signal RedMatch is activated, and a row address XADDd1, which is a replacement destination, is generated. The addresses XADDi and XADDd1 are supplied to a multiplexer 646; wherein, if the hit signal RedMatch is not activated, the address XADDi is selected; and, if the hit signal RedMatch is activated, the address XADDd1 is selected. The selected address XADD2 is supplied to an X address decoder 648. The X address decoder 648 controls the operation of the word line indicated by the address XADD2, the sense amplifier corresponding thereto, an equalize circuit, etc. based on the word-line actuation signal wdEn, the sense-amplifier actuation signal saEn, and the bit-line equalize signal BLEQ.

FIG. 7 is a timing diagram of a refresh operation according to an embodiment of the present disclosure. The timing diagram 700 may illustrate staggered refresh timing of a particular example memory device that includes two physical ranks (physical rank 0 and physical rank 1), each of which includes 4 logical ranks (e.g., logical 0-3). The example memory device which operates according to the timing diagram 700 may have a minimum time after a first logical rank is put into a refresh mode before a next logical rank can be put into refresh. In some embodiments, the timing diagram 700 may illustrate a memory module (such as the memory module 400 of FIG. 4) which includes two 3DS packages (e.g., packages similar to the memory package 200 of FIG. 2). Each of the two packages may represent a physical rank, while each die within those packages may represent a logical rank of their respective physical rank.

At a first time, t0 (and at subsequent times t1-t4) both of the physical ranks may receive a refresh signal (e.g., AREF). This may cause both physical ranks to begin performing a refresh operation (either an auto-refresh or a targeted refresh) in the first logical rank. In the example embodiment of the timing diagram 700, there is a minimum time tmin that must elapse before a next logical rank may be put into a refresh operation. This time, tmin, may represent a property of the system, and may for example, be a setting of the memory device. The timing diagram 700 illustrates a scenario where refresh operations are performed with the minimum allowable timing (e.g., with tmin between each refresh operation triggered by the refresh signal). Accordingly, at t0, Logical 0 begins performing a refresh operation. A short time after t0 (determined by the minimum timing of the memory), Logical 1 begins performing a refresh operation. A short time after that, Logical 2 begins performing a refresh operation, and so forth.

In some embodiments, a refresh operation that each logical rank performs may be longer than the minimum delay time, and thus the refresh operations in the different logical ranks may overlap with each other in time. In some embodiments, the timing of the refresh operations and the AREF signals may be such that as soon as the final refresh operation concludes (e.g., after Logical 3 finishes its refresh operation), a new AREF is received, which causes the first logical rank (e.g., Logical 0) to begin a refresh operation again.

Each time one of the logical ranks performs a refresh operation responsive to one of the refresh signals, it may perform either an auto-refresh operation or a targeted refresh operation. Less wordlines may be refreshed during a targeted refresh than during an auto-refresh, and thus the targeted refresh may draw less power. Each of the logical ranks (e.g., the individual memory dies, such as dies 228 and 229a-c of FIG. 2 and/or dies 329a-b of FIG. 3) may perform auto-refresh operations at a same rate, but may be staggered in time. In some embodiments, the rate may be linked to the refresh signal AREF, such that there are a certain number of activations of AREF between each pair of targeted refresh operations for a given logical rank. In the particular embodiment shown in the timing diagram 700, there may be four auto-refresh operations between a given pair of targeted refresh operations. In other words, the targeted refresh operation may occur on every fifth activation of AREF.

In order to stagger the targeted refresh operations, each of the logical ranks (e.g., the memory dies) may include settings which offset the targeted refresh operations in time. In one example implementation, each logical rank may include a counter (e.g., in the refresh address control circuit 116 of FIG. 1) which counts AREF activations, however each logical rank may include settings, such as fuse settings, to change an initial value of the counter. The settings may also vary between the two logical ranks. In this manner, by staggering the timing of targeted refresh operations between dies, a maximum number of auto-refresh operations which occur at a given time may be reduced, which may reduce the maximum power during the refresh operations.

At a first time t0, both physical ranks receive a first AREF command. Responsive to the first AREF command, Logical 0 of Physical Rank 0 performs a targeted refresh operation, while the remaining ranks perform auto-refresh operations. At a second time t1, a next AREF is received, and in contrast to the first AREF command Logical 1 of Physical Rank 0 and Logical 0 of Physical Rank 1 both perform targeted refresh operations, while the remaining ranks perform auto-refresh operations. At a third time t2, responsive to a third AREF command, Logical 2 of Physical Rank 0 and Logical 1 of Physical Rank 1 both perform targeted refresh operations, while the remaining ranks perform auto-refresh operations. At a fourth time t3, responsive to a fourth AREF command, Logical 3 of Physical Rank 0 and Logical 2 of Physical Rank 1 both perform targeted refresh operations, while the remaining ranks perform auto-refresh operations. At a fifth time t4, responsive to a fifth AREF command, Logical 3 of Physical Rank 1 performs a targeted refresh operation while the remaining ranks perform auto-refresh operations. At a next time that AREF is received, the cycle may repeat, and Logical 0 of Physical Rank 0 may perform a targeted refresh operation.

As illustrated by the example operation of FIG. 7, there are a maximum of 7 ranks which perform an auto-refresh operation responsive to any given refresh command AREF. This may reduce the peak power which is pulled while the memory device is performing refresh operations.

FIG. 8 is a timing diagram of staggered refresh timing between refresh pumps according to an embodiment of the present disclosure. The timing diagram 800 shows an embodiment for a memory device, where responsive to each refresh signal (e.g., AREF), each memory die generates a plurality of refresh pumps, each of which triggers either an auto-refresh or a targeted refresh operation in their respective die. The targeted refresh operations may be staggered between different dies of a memory device such that a maximum number of auto-refresh operations which occur at any given point in time is reduced.

The timing diagram 800 may illustrate example refresh operations for a memory device with four dies (more or less dies may be used in other embodiments). The dies may all receive a refresh signal AREF at an initial time t0. In the example embodiment shown in the timing diagram 700, each of the dies may produce a series of refresh pumps responsive to receiving the refresh signal AREF. Since all four of the dies received the same activation of AREF, the refresh pumps may generally be synchronized with each other.

Each of the dies may include settings which determine whether an auto-refresh operation or a targeted refresh operation is performed responsive to a given pump. The settings may be used to stagger the targeted refresh operations between different refresh pumps. In the example embodiment of FIG. 8, four refresh pumps are generated responsive to each activation of AREF (more or less pumps may be generated in other embodiments). Each die may have settings to perform a targeted refresh operation on one or more particular refresh pumps (e.g., die 2 may be set to perform a targeted refresh on the second of the four pumps while die 3 may be set to perform a targeted refresh on the third of the four pumps). By varying the settings among the dies, the targeted refreshes may be staggered, which may reduce the peak refresh power requirements.

At a first time t1, which is after initial time t, each of the dies generates a first refresh pump. Die 1 performs a targeted refresh operation, while Dies 2-4 perform an auto-refresh operation. At a second time t2, each of the dies generates a second refresh pump, and Die 2 performs a targeted refresh operation while the remaining dies perform auto-refresh operations. At a third time t3, each die generates a third refresh pump, and Die 3 performs a targeted refresh operation while the remaining dies perform auto-refresh operations. At a fourth time 4, each of the dies generates a fourth refresh pump, and Die 4 performs a targeted refresh operation while the remaining dies perform auto-refresh operations. In this manner, there are never more than 3 auto-refresh operations during any given refresh pump.

FIG. 9 is a timing diagram of staggered refresh operations according to an embodiment of the present disclosure. The timing diagram 900 may represent an example embodiment, where the targeted refresh operations are staggered among refresh pumps, but each of the logical ranks (e.g., the dies) does not begin generating pumps at the same time. The memory device illustrated in the timing diagram 900 may be analogous to the example in timing diagram 700 of FIG. 7, in that the memory device may require that at least a minimum amount of time tMin elapses after a given logical rank (e.g., die) begins generating refresh pumps before a next logical rank begins generating refresh pumps. In the timing diagram 900, the logical ranks may begin generating refresh pumps, which in this example may be enough time such that a given rank generate two refresh pumps before the next logical rank can begin generating refresh pumps. In this embodiment, each logical rank may generate six refresh pumps responsive to entering a refresh mode (e.g., in response to a refresh signal such as AREF).

At a first time t0, Logical Rank 0 may begin generating refresh pumps. Pumps 1 and 2 in Logical Rank 0 may both indicate an auto-refresh operation. At a second time t1, Logical Rank 1 may also begin generating refresh pumps. Pumps 3 and 4 of Logical Rank 1, and pumps 1 and 2 of Logical Rank 1 may all be associated with auto-refresh operations. At a third time t2, Logical Rank 2 may begin generating refresh pumps. Pump 5 of Logical Rank 0 and Pump 4 of Logical Rank 1 may both be associated with targeted refresh operations, while pump 6 of Logical Rank 1, pump 3 of Logical Rank 1 and pumps 1 and 2 of Logical Rank 2 are associated with auto-refresh operations. At a fourth time t3, Logical Rank 0 may stop providing refresh pumps, since it has already provided 6 refresh pumps responsive to being entered into a refresh state. At t3 Logical Rank 3 may begin generating auto refresh pumps. Pump 3 of Logical Rank 2 and pump 2 of Logical Rank 3 may be associated with targeted refresh operations in their respective logical ranks, while pumps 5 and 6 of Logical Rank 1, pump 4 of Logical Rank 2 and pump 1 of Logical Rank 3 may all be associated with auto-refresh operations in their respective logical ranks. At a fifth time, t4, Logical Rank 1 may stop providing refresh pumps (since it has already provided 6 pumps). After t4, the remaining pumps in Logical Rank 2 and Logical Rank 3 may all be associated with auto-refresh operations in their respective dies.

In the embodiment of FIG. 9, each of the different logical ranks performed a targeted refresh operation after a different number of respective pumps (e.g., Logical Rank 1 performs a targeted refresh operation on pump 5, while Logical Rank 1 performs a targeted refresh operation on pump 4). In some embodiments, each of the different logical ranks may include settings, such as fuse settings, internal to the die to control the number of pumps before a targeted refresh operation is performed. Since the logical ranks all start providing pumps at different times, the first targeted refresh operation (e.g., at pump 5 of Logical Rank 0) may be delayed until a maximum number of pumps are occurring at a given time. In the example embodiment of timing diagram 900, the maximum number of pumps which occur at a given time is 3, which happens between t2 and t4. The targeted refreshes in each die are timed such that when there are a maximum number of refresh pumps at a given time (e.g., 3), at least one of them is associated with a targeted refresh operation in at least one of the dies. In some embodiments, the targeted refresh operations may be timed such that they do not start until a maximum number of simultaneous refresh pumps are occurring (e.g., at t2), and that they end when a maximum number of simultaneous refresh pumps are no longer occurring (e.g., at t4). Accordingly, there are never more than two auto-refresh operations which occur at any given point in time.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
an interface die configured to provide a refresh signal; and
a plurality of memory dies coupled in common to the refresh signal, wherein responsive to the refresh signal, at least one, but less than all, of the plurality of memory dies performs an auto-refresh operation,
wherein responsive to the refresh signal, at least one of the plurality of memory dies performs a targeted refresh operation, and
wherein a first number of word lines are refreshed as part of the auto-refresh operation, wherein a second number of word lines are refreshed as part of the targeted refresh operation, and wherein the first number is greater than the second number.

2. An apparatus comprising:
an interface die configured to provide a refresh signal; and
a plurality of memory dies coupled in common to the refresh signal, wherein responsive to the refresh signal, at least one, but less than all, of the plurality of memory dies performs an auto-refresh operation,
wherein responsive to the refresh signal a number of the plurality of memory dies performs the auto-refresh operation while at least one memory die in a remainder of the plurality of memory dies performs a targeted refresh operation.

3. An apparatus comprising:
an interface die configured to provide a refresh signal; and
a plurality of memory dies coupled in common to the refresh signal, wherein responsive to the refresh signal, at least one, but less than all, of the plurality of memory dies performs an auto-refresh operation, wherein responsive to the refresh signal, up to a maximum number of the plurality of memory dies perform a refresh operation, and wherein when the maximum number of the plurality of memory dies performs the refresh operation at least one of the maximum number of the plurality of memory dies does not perform an auto-refresh operation.

4. The apparatus of claim 3, wherein the at least one of the maximum number of the plurality of memory dies performs a different type of refresh operation.

5. The apparatus of claim 1, wherein the interface die and the plurality of memory dies are organized into a memory stack.

6. An apparatus comprising:
an interface configured to provide an activation of a refresh signal;
a first memory die comprising a first memory array, the first memory die configured to refresh a first number of word lines of the first memory array responsive to the activation of the refresh signal; and
a second memory die comprising a second memory array, the second memory die configured to refresh a second number of word lines of the second memory array responsive to the activation of the refresh signal, wherein the second number is less than the first number, wherein refreshing the first number of word lines is associated with an auto-refresh operation and refreshing the second number of word lines is associated with a targeted refresh operation.

7. The apparatus of claim 6, wherein the interface, the first memory die and the second memory die are part of a memory stack.

8. An apparatus comprising:
an interface configured to provide an activation of a refresh signal;
a first memory die comprising a first memory array, the first memory die configured to refresh a first number of word lines of the first memory array responsive to the activation of the refresh signal; and
a second memory die comprising a second memory array, the second memory die configured to refresh a second number of word lines of the second memory array responsive to the activation of the refresh signal, wherein the second number is less than the first number, wherein responsive to a second activation of the refresh signal the first memory die is configured to refresh the second number of word lines of the first memory array and the second memory die is configured to refresh the first number of word lines of the second memory array.

9. An apparatus comprising:
an interface configured to provide an activation of a refresh signal;
a first memory die comprising a first memory array, the first memory die configured to refresh a first number of word lines of the first memory array responsive to the activation of the refresh signal; and
a second memory die comprising a second memory array, the second memory die configured to refresh a second number of word lines of the second memory array responsive to the activation of the refresh signal, wherein the second number is less than the first number, wherein the first memory die is configured to provide activations of a first refresh pump signal responsive to the activation of the refresh signal, and configured to perform a refresh operation responsive to each activation of the first refresh pump signal,
wherein the second memory die is configured to provide activations of a second refresh pump signal responsive to the activation of the refresh signal, and configured to perform a refresh operation responsive to each activation of the second refresh pump signal, and
wherein the first memory die refreshes the first number of word lines responsive to a first activation of the first refresh pump signal while the second memory die refreshes the second number of word lines responsive to a first activation of the second refresh pump signal.

10. The apparatus of claim 9, wherein the first activation of the first refresh pump signal and the first activation of the second refresh pump signal occur at a same time.

11. The apparatus of claim 9, wherein the first activation of the first refresh pump signal and the first activation of the second refresh pump signal occur at different times.

12. A method comprising:
receiving a refresh signal at a plurality of memory dies; and
performing at least one refresh operation in the plurality of memory dies responsive to the refresh signal, wherein the refresh operation is a first type of refresh operation or a second type of refresh operation, and wherein less than all of the plurality of memory dies perform the first type of refresh operation at the same time,
wherein performing the first type of refresh operation draws a first amount of current, and performing the second type of refresh operations draws a second amount of current, wherein the second amount of current is less than the first amount of current.

13. A method comprising:
receiving a refresh signal at a plurality of memory dies;
performing at least one refresh operation in the plurality of memory dies responsive to the refresh signal, wherein the refresh operation is a first type of refresh operation or a second type of refresh operation, and wherein less than all of the plurality of memory dies perform the first type of refresh operation at the same time; and
performing, with at least one of the plurality of memory dies, the second type of refresh operation responsive to the refresh signal.

14. The method of claim 13, further comprising:
refreshing a first number of word lines as part of the first type of refresh operation; and refreshing a second number of word lines less than the first number as part of the second type of refresh operation.

15. A method comprising:

receiving a refresh signal at a plurality of memory dies;

performing at least one refresh operation in the plurality of memory dies responsive to the refresh signal, wherein the refresh operation is a first type of refresh operation or a second type of refresh operation, and wherein less than all of the plurality of memory dies perform the first type of refresh operation at the same time; and performing the first type of refresh operation with a number of the plurality of memory dies while performing the second type of refresh operation with at least one of a remainder of the plurality of memory dies.

16. The method of claim 15, wherein at least another one of the remainder of the plurality of memory dies does not perform a refresh operation while the number of the plurality of memory dies is performing the first type of refresh operation.

\* \* \* \* \*